(12) United States Patent
Murata et al.

(10) Patent No.: US 8,278,151 B2
(45) Date of Patent: Oct. 2, 2012

(54) TAPE FOR HOLDING CHIP, METHOD OF HOLDING CHIP-SHAPED WORKPIECE, METHOD OF MANUFACTURING SEMICONDUCTOR DEVICE USING TAPE FOR HOLDING CHIP, AND METHOD OF MANUFACTURING TAPE FOR HOLDING CHIP

(75) Inventors: Shuhei Murata, Ibaraki (JP); Takeshi Matsumura, Ibaraki (JP); Koji Mizuno, Ibaraki (JP); Fumiteru Asai, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/969,959

(22) Filed: Dec. 16, 2010

(65) Prior Publication Data
US 2011/0159642 A1    Jun. 30, 2011

(30) Foreign Application Priority Data
Dec. 25, 2009   (JP) .................................. 2009-296116

(51) Int. Cl.
*H01L 21/00* (2006.01)
(52) U.S. Cl. .. 438/113; 438/114; 438/118; 257/E21.499
(58) Field of Classification Search .................. 438/113, 438/114, 118; 257/730, 783, E21.499
See application file for complete search history.

(56) References Cited

U.S. PATENT DOCUMENTS

| | | | | |
|---|---|---|---|---|
| 5,888,606 A | * | 3/1999 | Senoo et al. | 428/66.6 |
| 6,402,993 B1 | * | 6/2002 | Easter | 252/511 |
| 2005/0046042 A1 | * | 3/2005 | Matsumura et al. | 257/782 |
| 2006/0154066 A1 | * | 7/2006 | Kita et al. | 428/401 |
| 2006/0182983 A1 | * | 8/2006 | Paul et al. | 428/500 |
| 2007/0120271 A1 | * | 5/2007 | Kozakai et al. | 257/779 |

FOREIGN PATENT DOCUMENTS
JP        2008-100755        5/2008

* cited by examiner

*Primary Examiner* — Kevin Parendo
(74) *Attorney, Agent, or Firm* — Knobbe Martens Olson & Bear LLP

(57) ABSTRACT

The present invention aims to provide a tape for holding a chip that makes pasting and peeling of a chip-shaped workpiece easy. It is a tape for holding a chip having a configuration in which a pressure-sensitive adhesive layer is formed on a base material, wherein the pressure-sensitive adhesive layer has a chip-shaped workpiece pasting region onto which a chip-shaped workpiece is pasted and a frame pasting region onto which a mount frame is pasted, and that is used by pasting the mount frame to the frame pasting region, wherein the 180-degree peeling adhesive power of the pressure-sensitive adhesive layer to a silicon mirror wafer at the frame pasting region is 5 times or more the 180-degree peeling adhesive power of the pressure-sensitive adhesive layer to a silicon mirror wafer at the chip-shaped workpiece pasting region.

4 Claims, 3 Drawing Sheets

(a)

(b)

TAPE FOR HOLDING CHIP, METHOD OF HOLDING CHIP-SHAPED WORKPIECE, METHOD OF MANUFACTURING SEMICONDUCTOR DEVICE USING TAPE FOR HOLDING CHIP, AND METHOD OF MANUFACTURING TAPE FOR HOLDING CHIP

This application claims priority to Japanese Patent Application No. 2009-296116, filed Dec. 25, 2009. The aforementioned application is hereby incorporated by reference in its entirety.

BACKGROUND OF THE INVENTION

1. Field of the Invention

The present invention relates to a tape for holding a chip, a method of holding a chip-shaped workpiece, a method of manufacturing a semiconductor device using the tape for holding a chip, and a method of manufacturing the tape for holding a chip.

2. Description of the Related Art

Conventionally, a method has been known of manufacturing a semiconductor device including the steps of dicing a semiconductor wafer that is fixed to a dicing film into a plurality of semiconductor chips, picking up the semiconductor chips from the dicing film, and die bonding the semiconductor chips that are picked up to an adherend such as a substrate.

In recent years, there are cases where a dicing die bond film is used, in which a die bond film is laminated onto a dicing film instead of the dicing film. In this case, the semiconductor wafer is cut together with the die bond film in the dicing step, the semiconductor chips are picked up as semiconductor chips with a die bond film in the pickup step, and the semiconductor chips are die bonded to the adherend interposing this die bond film therebetween in the die bonding step.

On the other hand, there is a case where the semiconductor chips that are picked up are stored once without die bonded to the adherend. When storing the chip-shaped workpiece, conventionally, the semiconductor chips are pasted onto a pressure-sensitive adhesive tape such as a widely used dicing film and held to be stored.

However, when holding the semiconductor chips with a die bond film by pasting them to a pressure-sensitive adhesive tape, there are cases where the semiconductor chips with a die bond film held onto the pressure sensitive adhesive tape cannot be re-peeled therefrom because adherability of the die bond film to the pressure-sensitive adhesive tape is too strong and where it becomes difficult to re-peel the semiconductor chips with a die bond film off because the adhering strength increases as time passes when they are held for a long time.

Because of that, a sheet for die sorting has been conventionally proposed that is formed by exposing a pressure-sensitive adhesive layer at the outer circumference and exposing a base film at a center portion that is inside of the outer circumference (for example, refer to Japanese Patent Application Laid-Open No. 2008-100755). The sheet for die sorting described in Japanese Patent Application Laid-Open No. 2008-100755 temporarily attaches the semiconductor chips with a die bond film to the base film.

However, because the sheet for die sorting is for temporarily attaching semiconductor chips with a die bond film to a base film that does not have adhesive power, it is necessary to make the die bond film attached to the semiconductor chip have a certain level of adhesive power, and as a result, it narrows choices of materials that constitute the die bond film.

Further, in the case of a die bond film having weak adhesive power at normal temperature, it has to be heated for temporal attachment, and as a result, there is a problem that the manufacturing process becomes complicated.

When using a dicing film in the method of manufacturing a semiconductor device instead of the dicing die bond film, the sheet for die sorting cannot be used because the semiconductor chips that are picked up do not have the die bond film attached thereto and do not have adhesive power.

SUMMARY OF THE INVENTION

The present invention has been made in view of the above-described problems, and an object thereof is to provide a tape for holding a chip that makes pasting and peeling off of a chip-shaped workpiece easy, a method of holding the chip-shaped workpiece, a method of manufacturing a semiconductor device using the tape for holding a chip, and a method of manufacturing the tape for holding a chip.

The present inventors investigated a tape for holding a chip to solve the above-described conventional problems. As a result, it was found that a chip-shaped workpiece can be pasted and peeled off well by making the 180-degree peeling adhesive power of the tape to a silicon mirror wafer at a frame pasting region onto which a mount frame is pasted 5 times or more the 180-degree peeling adhesive power to a silicon mirror wafer at a chip-shaped workpiece pasting region onto which the chip-shaped workpiece is pasted under conditions of a measurement temperature of 23±3° C. and a tensile speed of 300 mm/min, and the present invention was completed.

That is, the present invention provides the following:

(1) A tape for holding a chip having a configuration in which a pressure-sensitive adhesive layer is formed on a base material, wherein the pressure-sensitive adhesive layer has a chip-shaped workpiece pasting region onto which a chip-shaped workpiece is pasted and a frame pasting region onto which a mount frame is pasted, and that is used by pasting the mount frame to the frame pasting region, wherein the 180-degree peeling adhesive power of the pressure-sensitive adhesive layer to a silicon mirror wafer at the frame pasting region is 5 times or more the 180-degree peeling adhesive power of the pressure-sensitive adhesive layer to a silicon mirror wafer at the chip-shaped workpiece pasting region under conditions of a measurement temperature of 23±3° C. and a tensile speed of 300 mm/min.

According to the configuration of (1), because the peeling adhesive power at the frame pasting region is 5 times or more the peeling adhesive power at the chip-shaped workpiece pasting region under the above-described conditions, the mount frame can be firmly pasted onto the frame pasting region where the adhesive power is relatively strong and the chip-shaped workpiece can be pasted onto the chip-shaped workpiece pasting region where the adhesive power is relatively weak so that the chip-shaped workpiece is peelable.

Especially, according to the configuration of (1), because the chip-shaped workpiece pasting region has certain weak adhesive power, the chip-shaped workpiece can be pasted even if the chip-shaped workpiece (for example, a semiconductor chip) does not have a resin layer having adhesive power (for example, a die bond film) attached of even if it is a chip-shaped workpiece with a resin layer that hardly exhibits adhesive power at room temperature or the temperature during storage.

The chip-shaped workpiece in the present invention encompasses both a chip-shaped workpiece with a resin layer that has adhesive power and a chip-shaped workpiece without a resin layer.

(2) The tape for holding a chip according to (1), wherein the 160-degree peeling adhesive power of the pressure-sensitive adhesive layer to a silicon mirror wafer at the chip-shaped workpiece pasting region is preferably 0.01 to 0.1 N/20-mm tape width under conditions of a measurement temperature of 23±3° C. and a tensile speed of 300 mm/min.

According to the configuration of (2), because the adhesive power of the pressure-sensitive adhesive layer at the chip-shaped workpiece pasting region is 0.01 N/20-mm tape width or more under the above-described conditions, the chip-shaped workpiece can be securely pasted and prevented from falling off. In addition, because the adhesive power is 0.1 N/20-mm tape width or less, the chip-shaped workpiece can be peeled off without operations such as heating and exposure to radiation upon peeling.

(3) The tape for holding a chip according to (1) or (2), wherein
the Young's modulus of the pressure-sensitive adhesive layer at the chip-shaped workpiece pasting region is preferably 3 MPa or more.

According to the configuration of (3), because the Young's modulus of the pressure-sensitive adhesive layer at the chip-shaped workpiece pasting region is 3 MPa or more, adhesion between the chip-shaped workpiece and the pressure-sensitive adhesive layer does not become too strong and the chip-shaped workpiece can be easily peeled off.

(4) The tape for holding a chip according to any one of (1) to (3) having a base and a radiation curable pressure-sensitive adhesive layer that is formed on the base, wherein
the chip-shaped workpiece pasting region is preferably formed in a manner that the adhesive power is reduced by curing by exposure to radiation.

According to the configuration of (4), because the chip-shaped workpiece pasting region is formed in a manner that the adhesive power is reduced by curing by exposure to radiation, the crosslinking density is high and the micro movement of the polymer that constitutes the pressure-sensitive adhesive layer is suppressed. Therefore, the increase of adhesion is small even if a workpiece is pasted onto the surface of a chip-shaped workpiece for a long period, and the chip-shaped workpiece can be easily peeled off even after it is pasted for a long period (for example, one month). Because the adhesive power of the chip-shaped workpiece pasting region can be set according to the radiation irradiation amount, a desired adhesive power can be easily obtained.

(5) The tape for holding a chip according to any one of (1) to (3), wherein
the pressure-sensitive adhesive layer is preferably formed such that a strong pressure-sensitive adhesive layer having the frame pasting region on the surface and a weak pressure-sensitive adhesive layer having the chip-shaped workpiece pasting region on the surface are not laminated on each other on the base.

(6) The tape for holding a chip according to any one of (1) to (3), wherein
the pressure-sensitive adhesive layer preferably has a strong pressure-sensitive adhesive layer and a weak pressure-sensitive adhesive layer that is laminated on the strong pressure-sensitive adhesive layer such that the outer circumference part of the strong pressure-sensitive adhesive layer is exposed,
the portion where the strong pressure-sensitive adhesive layer is exposed preferably corresponds to the frame pasting region, and
the surface of the weak pressure-sensitive adhesive layer preferably corresponds to the chip-shaped workpiece pasting region.

(7) The tape for holding a chip according to any one of (1) to (3), wherein
the pressure-sensitive adhesive layer preferably has a weak pressure-sensitive adhesive layer and a strong pressure-sensitive adhesive layer that is laminated on the weak pressure-sensitive adhesive layer such that the center portion of the weak pressure-sensitive adhesive layer is exposed,
the surface of the strong pressure-sensitive adhesive layer preferably corresponds to the frame pasting region, and
the portion where the weak pressure-sensitive adhesive layer is exposed preferably corresponds to the chip-shaped workpiece pasting region.

Further, the present invention provides the following:
(8) A method of holding a chip-shaped workpiece that is formed by dicing, including the steps of
pasting amount frame to the frame pasting region of the tape for holding a chip according to any one of (1) to (7) and
pasting a chip-shaped workpiece formed by dicing to the chip-shaped workpiece pasting region of the tape for holding a chip.

According to the configuration of (8), a chip-shaped workpiece formed by dicing can be stored once, for example, by fixing a mount frame by pasting it to the frame pasting region of the tape for holding a chip and by pasting the chip-shaped workpiece formed by dicing to the chip-shaped workpiece pasting region of the tape for holding a chip. The chip-shaped workpiece that has been stored can be used in manufacture of a semiconductor device, or the like as necessary.

Further, the present invention provides the following:
(9) A method of manufacturing a semiconductor device using the tape for holding a chip according to any one of (1) to (8), including the steps of
dicing a workpiece,
pasting a chip-shaped workpiece that is formed by dicing to the chip-shaped workpiece pasting region of the tape for holding a chip,
peeling the chip-shaped workpiece that is pasted to the tape for holding a chip off, and
fixing the peeled chip-shaped workpiece to an adherend.

According to the configuration of (9), the chip-shaped workpiece that is formed by dicing can be held by pasting it to the chip-shaped workpiece pasting region of the tape for holding a chip. Then, the chip-shaped workpiece is peeled off the tape for holding a chip when it is used, and fixed onto an adherend. Therefore, a small number of the chip-shaped workpieces that remain without being picked up in the pickup step are collected, held on the tape for holding a chip, and stored once, and then the stored chip-shaped workpieces can be used in the manufacture of a semiconductor device, for example. As a result, storage space of the chip-shaped workpieces can be saved.

(10) The method of manufacturing a semiconductor device according to (9), wherein
the peeling step is preferably a step of peeling the chip-shaped workpiece off without reducing the adhesive power of the chip-shaped workpiece pasting region.

According to the configuration of (10), because the chip-shaped workpiece can be peeled off without reducing the adhesive power of the chip-shaped workpiece pasting region, the manufacturing process can be simplified.

Further, the present invention provides following:
(11) A method of manufacturing the tape for holding a chip according to (4), including
a pressure-sensitive adhesive layer forming step of forming a radiation curable pressure-sensitive adhesive layer and
a radiation irradiation step of forming the chip-shaped workpiece pasting region having a reduced adhesive power by curing by irradiating one portion of the radiation curable pressure-sensitive adhesive layer with radiation and the uncured frame pasting region where the adhesive power is not reduced.

According to the configuration of (11), because the chip-shaped workpiece pasting region having a reduced adhesive power by curing by radiation irradiation and the uncured frame pasting region where the adhesive power is not reduced are formed, the adhesive power of the chip-shaped workpiece can be set according to the radiation irradiation amount and a desired adhesive power can be easily obtained. Further, because a difference in the adhesive power can be provided by exposure to radiation, the tape for holding a chip can be manufactured easily.

(12) The method of manufacturing a tape for holding a chip according to (11), comprising a radiation shielding layer forming step of forming a radiation shielding layer having a radiation shielding function on a portion corresponding to the frame pasting region of the radiation curable pressure-sensitive adhesive layer that is laminated on the base, wherein the radiation irradiation step is preferably a step of forming the chip-shaped workpiece pasting region having a reduced adhesive power by curing a portion of the radiation curable pressure-sensitive adhesive layer corresponding to the chip-shaped workpiece pasting region by irradiation with radiation from the surface of the base and the uncured frame pasting region of which the adhesive power is not reduced.

(13) The method of manufacturing a tape for holding a chip according to (12), wherein the radiation shielding layer forming step is preferably a step of forming the radiation shielding layer using a printing method.

DETAILED DESCRIPTION OF THE PREFERRED EMBODIMENTS

Figure 1:
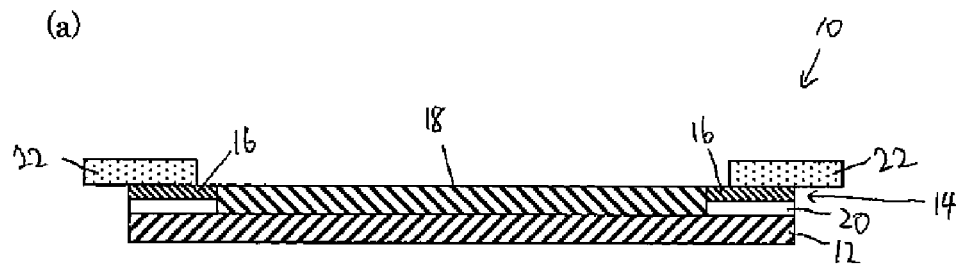
FIG. 1A is a schematic sectional drawing showing a tape for holding a chip according to a first embodiment of the present invention and FIG. 1B is a planar drawing thereof.
Figure 1:
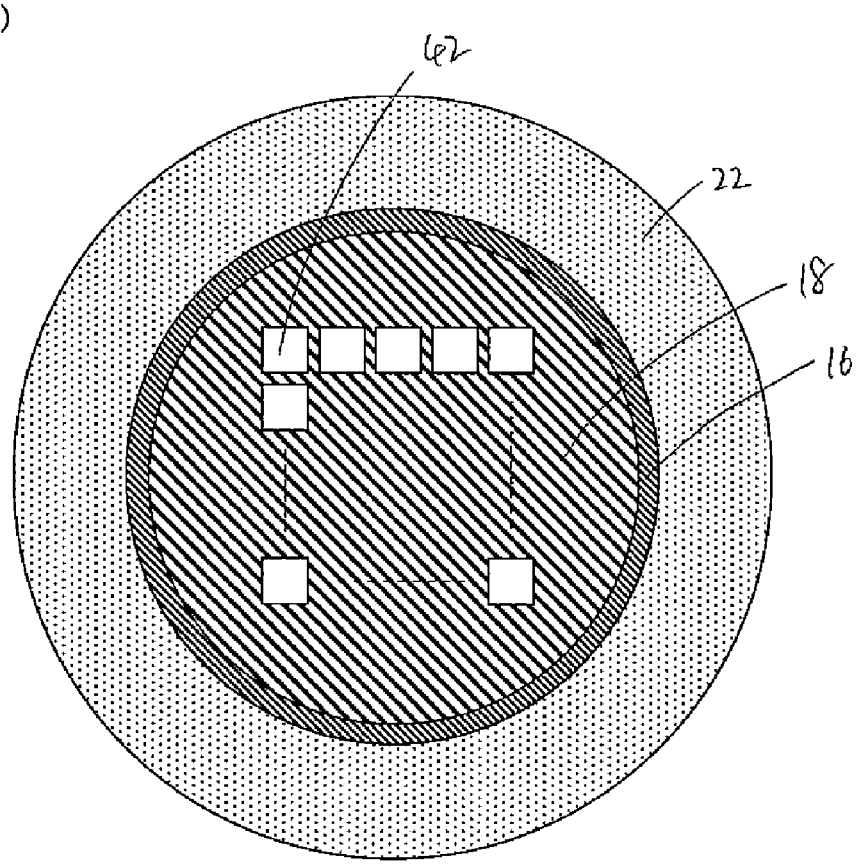

Embodiments of the present invention are explained below.
[First Embodiment]
FIG. 1A is a schematic sectional drawing showing a tape for holding a chip according to a first embodiment of the present invention and FIG. 1B is a planar drawing thereof. As shown in FIG. 1A, a tape for holding a chip 10 is configured by forming a printing layer 20 having a radiation shielding function formed along the outer circumference of a base 12 and by laminating a pressure-sensitive adhesive layer 14 on the base 12 where the printing layer 20 is not formed and on the printing layer 20.

The base 12 serves as a base body for strength of the tape for holding a chip 10. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

A known surface treatment such as a chemical or physical treatment such as a chromate treatment, ozone exposure, flame exposure, high voltage electric exposure, and an ionized ultraviolet treatment and a coating treatment by an undercoating agent (for example, a tacky substance described later) can be performed on the surface of the base material 12 in order to improve adhesiveness, holding properties, etc. with the adjacent layer. The same type or different type of base material can be appropriately selected and used as the base material 12, and a base material in which a plurality of types are blended can be used depending on necessity. Further, a vapor-deposited layer of a conductive substance composed of a metal, an alloy, an oxide thereof, etc. and having a thickness of about 30 to 500 angstrom can be provided on the base material 12 in order to give an antistatic function to the base material 12. The base material 12 may be a single layer or a multi layer of two or more types. Moreover, when the pressure-sensitive adhesive layer is a radiation curable pressure-sensitive adhesive layer, a base is preferably used as the base 12 that transmits at least a part of the radiation such as an x-ray, an ultraviolet ray, or an electron beam.

The thickness of the base material 12 can be appropriately decided without limitation particularly. However, it is generally about 5 to 200 µm.

The pressure-sensitive adhesive layer 14 has a frame pasting region 16 along the outer circumference in a plan view and has a chip-shaped workpiece pasting region 18 (also referred to as a chip pasting region 18 in the following) in the center in a plan view. The frame pasting region 16 is a region onto which a mount frame 22 is pasted when it is used and a region for fixing the tape for holding a chip 10 to the mount frame 22. The chip pasting region 18 is a region onto which a semiconductor chip 42 with a die bond film that is individualized when it is used or a semiconductor chip 42 without a die bond film is pasted. In the first embodiment, the region corresponding to the portion where the printing layer 20 is formed is the frame pasting region 16 and the region corresponding to the portion where the printing layer 20 is not formed is the chip pasting region 18.

The pressure-sensitive adhesive layer 14 is constituted by containing a radiation curable pressure-sensitive adhesive. The radiation curable pressure-sensitive adhesive can easily reduce its adhesive power by increasing the degree of crosslinking by exposure to radiation. In the pressure-sensitive adhesive layer 14 shown in FIGS. 1A and 1B, a difference in the adhesive power is provided between the chip pasting region 18 and the frame pasting region 16 due to exposure to radiation of the chip pasting region 18. In the first embodiment, when the entire surface of the tape for holding a chip 10 is irradiated with radiation from the surface of the base 12 (the lower side in FIG. 1A), the radiation reaches the chip pasting region 18 and the adhesive power decreases. On the other hand, because radiation is shielded at the frame pasting region 16 by the printing layer 20, the adhesive power does not decrease. Therefore, a difference in the adhesive power between the frame pasting region 16 and the chip pasting region 18 can be provided by irradiating the entire surface of the tape for holding a chip 10 with radiation from the surface of the base 12. Because the chip-shaped workpiece with a die bond film is pasted to the chip pasting region 18, which is cured and the adhesive power thereof is reduced, the interface between the chip pasting region 18 of the pressure-sensitive adhesive layer 14 and the die bond film has a characteristic that it is peeled off easily during pickup. On the other hand, the frame pasting region 16 that is not irradiated with radiation has sufficient adhesive power, and the tape for holding a chip 10 can be firmly fixed to the mount frame 22. Examples of the radiation include an ultraviolet ray and an electron beam.

The adhesive power to a silicon mirror wafer at the frame pasting region 16 of the pressure-sensitive adhesive layer 14 is 5 times or more, and preferably 10 times or more that at the chip pasting region 18. Because the peeling adhesive power at the frame pasting region 16 is 5 times or more the peeling adhesive power at the chip pasting region 18, the mount frame 22 can be firmly pasted to the frame pasting region 16 where the adhesive power is relatively strong and the semiconductor chip 42 can be pasted to the chip pasting region 18 where the adhesive power is relatively weak in a manner that it can be pasted and peeled off.

The adhesive power at the frame pasting region 16 of the pressure-sensitive adhesive layer 14 is preferably 0.2 to 20 N/20-mm tape width and more preferably 0.3 to 10 N/20-mm tape width. By making it 0.2 N/20-mm tape width or more, it is possible to firmly fix the pressure-sensitive adhesive layer 14 to the mount frame 22. By making it 20 N/20-mm tape width or less, the pressure-sensitive adhesive can be prevented from remaining on the mount frame 22.

The adhesive power at the chip pasting region 18 of the pressure-sensitive adhesive layer 14 is preferably 0.01 to 0.1 N/20 mm-tape width and more preferably 0.02 to 0.08 N/20 mm-tape width. The adhesive power at the frame pasting region 16 and the chip pasting region 18 of the pressure-sensitive adhesive layer 14 are values that are measured following JIS Z 0237, and are values obtained by pasting the pressure-sensitive adhesive sheet 10 to a silicon mirror wafer and then peeling it off at a measurement temperature of 23±3° C., an angle θ between the surface of the pressure-sensitive adhesive layer 14 and the surface of the silicon mirror wafer of 180°, and a tensile speed of 300 mm/min. When the adhesive power at the chip pasting region 18 is 0.01 N/20-mm tape width or more, the semiconductor chip 42 is surely pasted and prevented from falling off. When it is 0.1 N/20-mm tape width or less, the tape can be peeled off without operations such as heating and exposure to radiation upon peeling.

The Young's modulus at the frame pasting region 16 of the pressure-sensitive adhesive layer 14 is preferably 0.01 to 2 MPa and more preferably 0.05 to 1 MPa.

The Young's modulus at the chip pasting region 18 of the pressure-sensitive adhesive layer 14 is preferably 3 MPa or more and more preferably 5 MPa or more. Further, the Young's modulus at the chip pasting region 18 is preferably 1000 MPa or less and more preferably 100 MPa or less. When the Young's modulus at the chip pasting region 18 is 3 MPa or more, the chip can be easily peeled off. When the Young's modulus at the chip pasting region 18 is 1000 MPa or less, the chip can be easily fixed.

The Young's modulus in the present invention refers to a value that is measured under conditions of a temperature at measurement of 23±3° C., a humidity at measurement of 50±10% Rh, and a tensile speed of 50 mm/min using a test piece that is cut into a rectangular shape 100 mm in length and 50 mm in width following JIS K 7127.

The shear adhering strength at the frame pasting region 16 of the pressure-sensitive adhesive layer 14 is preferably 0.01 to 10 MPa and more preferably 0.1 to 5 MPa. When it is 0.01 MPa or more, the tape cannot be easily peeled off the frame during expanding, and when it is 10 MPa or less, the tape can be easily peeled off the frame after it is used.

The fixed load peeling speed at the frame pasting region 16 of the pressure-sensitive adhesive layer 14 is preferably 20 mm/hour or less and more preferably 10 mm/hour or less. This is because that falling off of the tape from the frame by the turning of ends of the tape can be prevented. The fixed load peeling speed in the present invention refers to a speed of peeling when a weight of 2 g is placed at one end of the tape for holding a chip 10 in a 90° direction (in the vertical direction) under the condition that an SUS304BA plate, on which the frame pasting region (a portion where printing is performed) of the tape for holding a chip 10 is pasted, is held horizontally with the tape for holding a chip 10 as the lower surface, with the tape being cut into a rectangular shape 100 mm in length and 20 mm in width.

A radiation curable pressure-sensitive adhesive having a radiation curable functional group such as a carbon-carbon double bond and that exhibits adherability can be used without special limitation. An example of the radiation curable pressure-sensitive adhesive that can be used is an addition type radiation curable pressure-sensitive adhesive in which a radiation curable monomer component and/or oligomer component are compounded into a general pressure-sensitive adhesive such as an acrylic pressure-sensitive adhesive or a rubber pressure-sensitive adhesive.

An acrylic pressure-sensitive adhesive containing an acrylic polymer as a base polymer is preferable as the pressure-sensitive adhesive from the viewpoint of cleaning and washing properties of an electronic part such as a semiconductor wafer or a glass part that dislike contamination with ultrapure water or an organic solvent such as alcohol.

Examples of the acrylic polymer include alkyl ester of (meth)acrylic acid (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl ester of (meth)acrylic acid (for example, cyclopentylester, cyclohexylester, etc.). These monomers may be used alone or two or more types may be used in combination. Among these, a polymer is preferable having a long hydrophobic side chain using alkyl (meth)acrylate having an alkyl group having 6 to 12 (especially 6 to 10) carbon atoms such as hexyl acrylate, heptyl acrylate, octyl acrylate, 2-ethylhexyl acrylate, isooctyl acrylate, nonyl acrylate, decyl acrylate, isodecyl acrylate, undecyl acrylate, and dodecyl acrylate as a monomer component. By using a polymer having a long hydrophobic side chain, compatibility of the chip pasting region 18 to the die bond film can be made relatively small, and the press bonded chip-shaped workpiece can be easily peeled off. The wording "esters of (meth)acrylic acid" means esters of acrylic acid and/or methacrylic acid. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth) acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth) acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth) acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. However, because the acrylic polymer preferably has a small number of polar groups in the present invention, it is preferable that these copolymerizable monomers are not used or that the amount of these monomers is 3% by weight or less of the entire monomer components. Among these monomer components, it is preferable that the acrylic polymer that constitute the pressure-sensitive adhesive layer 14 of the present invention does not contain acrylic acid as the monomer component. This is because the peeling property may be decreased by acrylic acid diffusing into the die bond film and by vanishing of the boundary surface of the pressure-sensitive adhesive layer 14 and the die bond film that is pasted to the pressure-sensitive adhesive layer 14.

For crosslinking, the acrylic polymer can also contain multifunctional monomers if necessary as the copolymerizable monomer component. Such multifunctional monomers include hexane dioldi(meth)acrylate, (poly)ethyleneglycoldi (meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acryl polymer can be performed by applying an appropriate manner such as a solution polymerization manner, an emulsion polymerization manner, a bulk polymerization manner, and a suspension polymerization manner to a mixture of one or two or more kinds of component monomers for example. Since the pressure-sensitive adhesive layer preferably has a composition in which the content of low molecular weight materials is suppressed from the viewpoint of prevention of wafer contamination, and since those in which an acryl polymer having a weight average molecular weight of 300000 or more, particularly 400000 to 30000000 is as a main component are preferable from such viewpoint, the pressure-sensitive adhesive can be made to be an appropriate cross-linking type with an internal cross-linking manner, an external cross-linking manner, etc. The number average molecular weight is obtained by measuring using GPC (Gel Permeation Chromatography).

An external crosslinking agent can be appropriately adopted in the pressure-sensitive adhesive to increase the number average molecular weight of the acrylic polymer or the like that is the base polymer. Specific examples of an external crosslinking method include a method of adding a so-called crosslinking agent such as a polyisocyanate compound, an epoxy compound, an aziridine compound, or a melamine crosslinking agent and reacting the product. When the external crosslinking agent is used, the used amount is appropriately determined by a balance with the base polymer to be crosslinked and further by the use as the pressure-sensitive adhesive. The amount of addition of the external crosslinking agent is preferably 0.1 to 20 parts by weight, and more preferably 0.2 to 10 parts by weight to 100 parts by weight of the base polymer. Further, various additives such as a tackifier and an antioxidant may be used in the pressure-sensitive adhesive other than the above-described components as necessary.

Examples of the radiation curing-type monomer component to be compounded include such as an urethane(meth) acrylate, trimethylolpropane tri(meth)acrylate, tetramethylolmethane tetra(meth)acrylate, pentaerythritol tri(meth) acrylate, pentaerythritol tetra(meth)acrylate, dipentaerythritol monohydroxypenta(meth)acrylate, dipentaerythritol hexa(meth)acrylate, and 1,4-butane dioldi(meth) acrylate Further, the radiation curing-type oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation curing-type monomer component and the oligomer component can be appropriately determined to an amount in which the adhesive strength of the pressure-sensitive adhesive layer can be decreased depending on the type of the pressure-sensitive adhesive layer. Generally, it is for example 1 to 200 parts by weight, and preferably about 5 to 100 parts by weight based on 100 parts by weight of the base polymer such as an acryl polymer constituting the pressure sensitive adhesive.

Further, besides the added type radiation curing-type pressure-sensitive adhesive described above, the radiation curing-type pressure-sensitive adhesive includes an internal radiation curing-type pressure-sensitive adhesive using an acryl polymer having a radical reactive carbon-carbon double bond in the polymer side chain, in the main chain, or at the end of the main chain as the base polymer. The internal radiation curing-type pressure-sensitive adhesives of an internally provided type are preferable because they do not have to contain the oligomer component, etc. that is a low molecular weight component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radiation curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on anyone of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with anyone of the hydroxyl-containing monomers exemplified above, or an ether compound such as 2-hydroxyethyl vinyl ether, 4-hydroxybutyl vinyl ether or diethylene glycol monovinyl ether.

The intrinsic type radiation curable adhesive may be made only of the above-mentioned base polymer (in particular, the acrylic polymer), which has a carbon-carbon double bond. However, the above-mentioned radiation curable monomer component or oligomer component may be incorporated into the base polymer to such an extent that properties of the adhesive are not deteriorated. The amount of the radiation curable oligomer component or the like is usually 100 parts or less by weight, preferably from 0 to 50 parts by weight for 100 parts by weight of the base polymer. In the present invention, the amount of the compounded radiation curable monomer component and/or oligomer component is preferably 0 to 100 parts by weight, and more preferably 0 to 80 parts by weight to 100 parts by weight of the base polymer that constitutes the pressure-sensitive adhesive. By compounding the radiation curable monomer component and/or oligomer component, curing by radiation can be promoted, the adhesive power of the chip pasting region 18 can be made relatively small, and the press bonded chip-shaped workpiece can be easily peeled off.

The ultraviolet curing-type pressure-sensitive adhesive preferably contains a photopolymerization initiator in the case of curing it with an ultraviolet ray or the like Examples of the photopolymerization initiator include α-ketol compounds such as 4-(2-hydroxyethoxy)phenyl (2-hydroxy-2-propyl) ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation curing-type pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The thickness of the pressure-sensitive adhesive layer 14 is not especially limited. However, from the viewpoint of fixing and holding the chip-shaped workpiece, it is preferably about 1 to 50 μm, more preferably 2 to 30 μm, and further preferably 5 to 25 μm.

The printing layer 20 is made of a material having a radiation shielding function. In the present invention, the radiation shielding function refers to a function of reducing the transmission amount of not only visible rays but also radiation including an x-ray, an ultraviolet ray, and an electron beam (especially, radiation that can activate a photopolymerization initiator to cure the radiation curable pressure-sensitive adhesive). A material that can completely shield the transmission of radiation (especially, radiation that can activate a photopolymerization initiator in the radiation curable pressure-sensitive adhesive layer) is more preferable as the material having the radiation shielding function. However, a material that can make the transmission of radiation (especially, radiation that can activate a photopolymerization initiator in the radiation curable pressure-sensitive adhesive layer) 50% or less (especially, 10% or less) is preferable. Therefore, a decrease of the 180-degree peeling adhesive power at the frame pasting region in the radiation curable pressure-sensitive adhesive layer as the pressure-sensitive adhesive layer 14 can be suppressed or prevented by the printing layer 20 even when it is irradiated with radiation from the base 12 side, and the ratio of the 180-degree peeling adhesive power at the chip-shaped workpiece pasting region in the pressure-sensitive adhesive layer 14 and the 180-degree peeling adhesive power at the frame pasting region can be controlled. The 180-degree peeling adhesive power at the frame pasting region of the pressure-sensitive adhesive layer 14 after is it irradiated with radiation from the base 12 side is 50% or more (especially, 80% or more, and above all, 90% or more) to the 180-degree peeling adhesive before radiation irradiation, and it is preferably in a range of 0.2 to 20 N/20 mm under conditions of a peeling angle of 180°, a measurement temperature of 23±3°

C., a tensile speed of 50 mm/min using a silicon mirror wafer as the adherend. The material having the radiation shielding function is preferably appropriately selected according to the types of the photopolymerization initiator. Specifically, the material having the radiation shielding function is not especially limited, but examples thereof include ink containing an inorganic substance having ultraviolet ray absorbency such as $CeO_2$, $TiO_2$, $ZnO$, $Fe_2O_3$, $V_2O_5$, or $PbO$ and an aluminum-deposited PET film (an aluminum-deposited polyethylene terephthalate film). The thickness of the printing layer 20 is not especially limited, but it is normally 50 μm or less (for example, 0.05 to 50 μm), preferably 0.05 to 10 μm, and more preferably about 0.1 to 2 μm.

The tape for holding a chip 10 can be used for holding a semiconductor chip that is individualize using a dicing film (a semiconductor chip in which a resin layer such as a die bond film is not formed on the backside) in a peelable manner because the chip pasting region 18 has the adhesive power. Further, it can also be used with a silicon wafer before being made into an individual piece (for example, a silicon wafer whose backside is ground, or a silicon wafer polished after backside grinding).

Further, the tape for holding a chip 10 can also be used for holding a semiconductor chip with a die bond film that is individualized using a dicing die bond film in a peelable manner. Next, the dicing die bond film that is pasted to the tape for holding a chip is explained.

(Dicing Die Bond Film)

Figure 2:
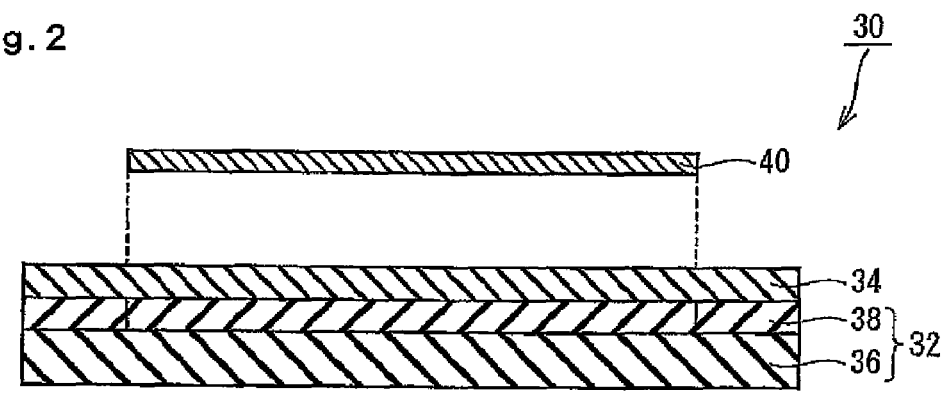
FIG. 2 is a schematic sectional drawing showing a dicing die bond film according to the first embodiment of the present invention.

FIG. 2 is a schematic sectional drawing showing a dicing die bond film according to the first embodiment of the present invention. As shown in FIG. 2, a dicing die bond film 30 has a configuration in which a die bond film 34 is laminated onto a dicing film 32. The dicing film 32 is configured by laminating a pressure-sensitive adhesive layer 38 onto a base 36, and the die bond film 34 is provided onto the pressure-sensitive adhesive layer 38. Because a conventionally known dicing film can be used as the dicing film 32 that constitutes the dicing die bond film 30, a detailed explanation of the dicing film 32 is omitted here.

An example of the adhesive composition that constitutes the die bond film 34 is a composition in which a thermoplastic resin and a thermosetting resin are used together. Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-contained resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor element.

The acrylic resin is not limited to any especial kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and dodecyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl (meth)acrylate, and (4-hydroxymethylcyclohexyl)methylacrylate; monomers which contain a sulfonic acid group, such as styrenesulfonic acid, allylsulfonic acid, 2-(meth) acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate.

The compounded ratio of the thermosetting resin is not especially limited as long as it is at a level that the die bond film 34 exhibits a function as a thermosetting film when it is heated under a condition of 100 to 250° C. However, in general, it is preferably in a range of 5 to 60% by weight and more preferably in a range of 10 to 50% by weight.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonyiphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

In order to crosslink the die bond film 34 of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

Further, an inorganic filler can be appropriately compounded in the die bond film 34 depending on its use. The compounding of the inorganic filler imparts conductivity and enables improvement of thermal conductivity, adjustment of the modulus of elasticity, and the like. Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof.

If necessary, other additives besides the inorganic filler may be incorporated into the die bond film 34 of the present invention. Examples thereof include a flame retardant, a silane coupling agent, and an ion trapping agent. Examples of the flame retardant include antimony trioxide, antimony pentaoxide, and brominated epoxy resin. These may be used alone or in combination of two or more thereof. Examples of the silane coupling agent include β-(3,4-epoxycyclohexyl) ethyltrimethoxysilane, γ-glycidoxypropyltrimethoxysilane, and γ-glycidoxypropylmethyldiethoxysilane. These may be used alone or in combination of two or more thereof. Examples of the ion trapping agent include hydrotalcite and bismuth hydroxide. These may be used alone or in combination of two or more thereof.

The thickness of the die bond film 34 (in the case that the film is a laminate, the total thickness thereof) is not particularly limited, and is, for example, from about 5 to 100 μm, preferably from about 5 to 50 μm.

(Production of the Tape for Holding a Chip)

The tape for holding a chip 10 according to the first embodiment (refer to FIG. 1A) can be produced as follows, for example.

First, the base 12 (refer to FIG. 1A) can be formed by a conventionally known film forming method. Examples of the film forming method include a calendar film forming method, a casting method in an organic solvent, an inflation extrusion method in a closed system, a T die extrusion method, a coextrusion method, and a dry laminating method.

Next, the printing layer 20 is formed on the base 12 by a printing method (a step of forming a radiation shielding layer). The printing method is not especially limited, and examples thereof include a relief stamping printing method, a lithography method, an intaglio printing method, and a stencil printing method.

Next, the pressure-sensitive adhesive layer 14 is formed by forming a coating film by applying a pressure-sensitive adhesive composition solution onto the base 12 and then drying (and optionally heat-crosslinking) the coating film under a prescribed condition (a step of forming a pressure-sensitive adhesive layer). The application method is not especially limited, and examples thereof include roll coating, screen coating, and gravure coating. The drying can be performed at a drying temperature of 80 to 150° C. and a drying time of 0.5 to 5 minutes. The pressure-sensitive adhesive layer 14 may also be formed by forming a coating film on a separator by applying a pressure-sensitive adhesive composition thereonto and then drying the coating film under the above-described drying condition. After that, the pressure-sensitive adhesive layer 14 is pasted onto the base 12 together with the separator. With this operation, the tape for holding a chip 10 can be manufactured.

Next, the entire surface of the tape for holding a chip 10 is irradiated with radiation from the base 12 side (a step of irradiation radiation). Because radiation reaches the chip pasting region 18 in this way, the chip pasting region 18 is cured and the adhesive power decreases. At this time, the curing of the pressure-sensitive adhesive layer 14 is performed by making the amount of the radiation irradiation constant to a level so that the pressure-sensitive adhesive layer 14 has a fixed adhesive power (for example, 0.01 to 0.1 N/20-mm tape width as the 180-degree peeling adhesive power). The irradiation condition of radiation is not especially limited as long as the 180-degree peeling adhesive power at the chip-shaped workpiece pasting region of the pressure-sensitive adhesive layer 14 becomes 20% or less (⅕ or less) of the 180-degree peeling adhesive power at the frame pasting region under conditions of a peeling angle of 180', a measurement temperature of 23±3° C., a tensile speed of 300 mm/min, and using a silicon mirror wafer as the adherend, and it is possible to employ irradiation conditions that the irradiation intensity of an ultraviolet with a wavelength of 10 to 400 nm is in a range of 1 to 200 mW/cm$^2$ (preferably 10 to 100 mW/cm$^2$) and the ultraviolet-ray accumulative amount is in a range of 100 to 1000 mJ/cm$^2$ (preferably 200 to 800 mJ/cm$^2$) for example. Specifically, it is possible to employ irradiation conditions with light irradiation by a high pressure mercury lamp having an irradiation intensity in a range of 1 to 200 mW/cm$^2$ (preferably 10 to 100 mW/cm$^2$) and an ultraviolet-ray accumulative amount in a range of 100 to 1000 mJ/cm$^2$ (preferably 200 to 800 mJ/cm$^2$) for example.

On the other hand, because radiation is shielded at the frame pasting region 16 by the printing layer 20, the adhesive power is maintained as it is with little decrease. Accordingly, the tape for holding a chip 10 can be produced in which a difference in the adhesive power is provided between the frame pasting region 16 and the chip pasting region 18.

(Production of a Dicing Die Bond Film)

The dicing die bond film 30 (refer to FIG. 2) can be produced as follows, for example.

First, an adhesive composition solution that is a material for forming a die bond film is produced. Next, an adhesive layer 34 is formed by forming a coating film by applying the adhesive composition solution onto a base separator to give a prescribed thickness and then drying the coating film under a prescribed condition. The application method is not especially limited, and examples thereof include roll coating, screen coating, and gravure coating. The drying is performed at a drying temperature of 70 to 160° C. and a drying time of 1 to 5 minutes, for example. The adhesive layer may be formed by forming a coating film by applying a pressure-sensitive adhesive composition onto a separator and then drying the coating film under the above-described drying condition. After that, the adhesive layer is pasted onto the base separator together with the separator.

Then, the separator is peeled off the adhesive layer 34, and pasted to the dicing film 32. At this time, the adhesive layer and the dicing film 32 are pasted together so that the adhesive layer and the pressure-sensitive adhesive layer 38 of the dicing film 32 are pasted together. The pasting can be performed by press bonding, for example. At this time, the laminating temperature is not especially limited, but it is preferably 30 to 50° C., and more preferably 35 to 45° C., for example. The line pressure is not especially limited, but it is preferably 0.1 to 20 kgf/cm, and more preferably 1 to 10 kgf/cm, for example. Next, the base separator on the adhesive layer is peeled off, and the dicing die bond film 30 can be obtained.

(Manufacture of a Semiconductor Device)

Next, a method of manufacturing a semiconductor device is explained.

First, a semiconductor wafer 40 is fixed onto the dicing die bond film 30 by press bonding (refer to FIG. 2). The present step is performed while pressing with a pressing means such as a pressing roll. The laminating temperature at the time of mounting is not particularly limited and is, for example, preferably within a range from 20 to 80° C.

Next, the dicing of the semiconductor wafer 40 is performed. Accordingly, the semiconductor wafer 40 is cut into a prescribed size and individualized, and a semiconductor chip 42 is produced. The dicing is performed following a normal method from the circuit face side of the semiconductor wafer 40, for example. Further, the present step can adopt such as a cutting method called full-cut that forms a slit in the dicing die bond film 30. The dicing apparatus used in the present step is not particularly limited, and a conventionally known apparatus can be used.

Pickup of the semiconductor chip 42 is performed in order to peel a semiconductor chip 42 that is adhered and fixed to the dicing die bond film 30. The method of picking up is not particularly limited. Examples include a method of pushing up the individual semiconductor chip 42 from the dicing die bond film 30 side with a needle and picking up the pushed semiconductor chip 42 with a picking-up apparatus.

There is a case where not all of the semiconductor chips are used in the pickup step, and in that case, a portion (for example, a small number) of the semiconductor chips 42 remain on the dicing film 32 as they are.

At this stage, mount frame 22 is pasted to the frame pasting region 16 of the tape for holding a chip 10 (refer to FIG. 1B) in advance. Then, the semiconductor chips 42 that remain on the dicing film 32 are pasted to the tape for holding a chip 10. The pasting can be performed by press bonding. With this operation, the plurality of semiconductor chips 42 that remain on the dicing film 32 are collected, held, and stored on the tape for holding a chip 10 once, and then the stored semiconductor chips 42 can be used in manufacture of a semiconductor device. As a result, storage space of the semiconductor chips 42 can be saved. Pasting to the tape for holding a chip 10 is performed for temporarily holding the semiconductor chips 42. That is, because the semiconductor chips 42 that are pasted to the tape for holding a chip 10 are peeled off again later, a post curing step such as thermal curing of the die bond film is not performed in this pasting step.

The semiconductor chips 42 that are collected using the tape for holding a chip 10 are separately used in manufacture of a semiconductor device. Accordingly, a method of manufacturing a semiconductor device using the semiconductor chips 42 is explained by referring to FIG. 3.

Figure 3:
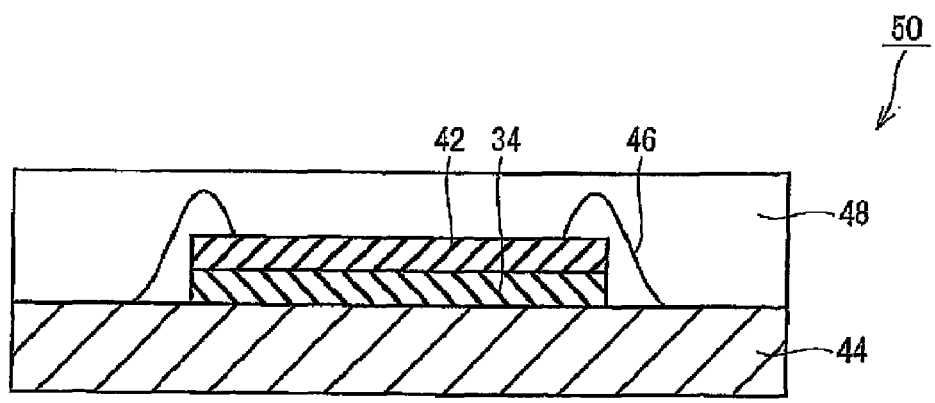
FIG. 3 is a schematic sectional drawing showing a semiconductor device according to an embodiment of the present invention.

FIG. 3 is a schematic sectional drawing showing a semiconductor device according to the first embodiment of the present invention. First, the semiconductor chip 42 with a die bond film 36 that is pasted to the tape for holding a chip 10 is peeled off without decreasing the adhesive power of the chip pasting region 18. "Peeling without decreasing the adhesive power" refers to peeling of a chip-shaped workpiece (a semiconductor chip) without causing a chemical change such that the adhesive power is decreased by irradiating the radiation curable pressure-sensitive adhesive layer with radiation to cure the layer or without causing a physical change such that the adhesive power is decreased by heating the pressure-sensitive adhesive layer having a heat foamability that is described later. The peeling can be performed by pickup in the same manner as to pickup a semiconductor chip that is diced normally in the die bonding step.

The semiconductor chip 42 that is picked up is adhered and fixed (die bonded) to an adherend 44 interposing the die bond film 34 as shown in FIG. 3. Examples of the adherend 44 include a lead frame, a TAB film, a substrate, and a semiconductor chip that is produced separately. The adherend 44 may be a deforming type adherend that can be easily deformed or may be a non-deforming type adherend such as a semiconductor wafer that is hard to deform.

A conventionally known substrate can be used as the substrate. Further, a metal lead frame such as a Cu lead frame and a 42 Alloy lead frame and an organic substrate composed of glass epoxy, BT (bismaleimide-triazine), and polyimide can be used as the lead frame. However, the present invention is not limited to this, and includes a circuit substrate that can be used by mounting a semiconductor element and electrically connecting with the semiconductor element.

Because the die bond film 34 is of a thermosetting type, its heat resistant strength is improved by adhering and fixing the semiconductor chip 42 to the adherend 44 by heat curing. A product obtained by adhere and fix the semiconductor chip 42 to a substrate, or the like can be subjected to a reflow step.

In the method of manufacturing a semiconductor device according to the present embodiment, wire bonding may be performed without going through the thermal curing step by a heat treatment of the die bond film 34, and it is also possible to seal the semiconductor chip 42 with a sealing resin and post cure the sealing resin.

The wire bonding is a step of electrically connecting the tip of a terminal part (inner lead) of the adherend 44 and an electrode pad (not shown in the drawing) on the semiconductor chip 42 with a bonding wire 46. The bonding wires 46 may be, for example, gold wires, aluminum wires, or copper wires. The temperature when the wire bonding is performed is from 80 to 250° C., preferably from 80 to 220° C. The heating time is from several seconds to several minutes. The connection of the wires is performed by using a combination of vibration energy based on ultrasonic waves with compression energy based on the application of pressure in the state that the wires are heated to a temperature in the above-mentioned range. The present step can be performed without performing thermal curing of the die bond film 34.

The sealing step is a step of sealing the semiconductor chip 42 with a sealing resin 48. This step is performed for protecting the semiconductor chip 42 that is loaded on the adherend 44 and the bonding wire 46. This step is performed by molding a resin for sealing with a mold. An example of the sealing resin 48 is an epoxy resin. The heating temperature during the resin sealing is normally 175° C. and it is performed for 60 to 90 seconds. However, the present invention is not limited thereto, and the curing can be performed at 165 to 185° C. for a few minutes, for example. With this operation, the sealing resin is cured and the semiconductor chip 42 and the adherend 44 are bonded together interposing the die bond film 34 therebetween.

In the post curing step, the sealing resin 48 that is insufficiently cured in the sealing step is completely cured. Even when the die bond film 34 is not completely thermally cured in the sealing step, complete thermal curing of the die bond film 34 together with the sealing resin 48 becomes possible in the present step. The heating temperature in the present step varies according to the types of the sealing resin. However, it is in a range of 165 to 185° C. for example, and the heating time is about 0.5 to 8 hours. With the above configuration, a semiconductor device 50 is manufactured.

In the tape for holding a chip 10 according to the first embodiment, a case of forming the printing layer 20 by printing is explained. However, formation of the layer having a radiation shielding function is not limited to the printing layer in the present invention, and the layer may be formed by application or the like.

In the tape for holding a chip 10 according to the first embodiment, a case in which the printing layer 20 is formed between the base 12 and the pressure-sensitive adhesive layer 14 is explained. However, the ultraviolet ray shielding layer (the printing layer) may be formed on the surface opposite to the pressure-sensitive adhesive layer of the base in the present invention.

In the tape for holding a chip 10 according to the first embodiment, the case of providing the printing layer 20 and of providing a difference in the adhesive power between the frame pasting region 16 and the chip pasting region 18 provided by irradiating the entire surface of the tape for holding a chip 10 with radiation is explained. However, only the chip pasting region 18 may be irradiated with radiation without providing the radiation shielding layer (the printing layer 20) in the present invention. In this case, exposure to radiation may be performed by interposing a mask for shielding the frame pasting region from the radiation irradiation on the tape for holding a chip.

In the tape for holding a chip 10 according to the first embodiment, the case in which a difference in the adhesive power between the frame pasting region 16 and the chip pasting region 18 is provided by radiation irradiation is explained. However, the present invention is not limited to this, and a difference in the adhesive power between the frame pasting region 16 and the chip pasting region 18 may be provided by applying pressure-sensitive adhesive composition solutions with different compositions. In this case, the pressure-sensitive adhesive composition solution explained in the first embodiment may be used on the frame pasting region 16, and a pressure-sensitive adhesive composition solution that is produced by appropriately adjusting the composition so that the adhesive power becomes ⅕ of the adhesive power at the frame pasting region 16 may be used on the chip pasting region 18. When the pressure-sensitive adhesive composition solutions with different compositions are applied to each region, there is no need to provide the radiation shielding layer (the printing layer 20). Further, there is no need to use the radiation curable pressure-sensitive adhesive, and a general pressure-sensitive adhesive may be used.

In the tape for holding a chip 10 according to the first embodiment, the case in which a difference in the adhesive power between the frame pasting region 16 and the chip pasting region 18 is provided by radiation irradiation is explained. However, a heat peelable pressure-sensitive adhesive may be used in the present invention. This is because a difference in the adhesive power between the frame pasting region and the chip-shaped workpiece pasting region can be provided even when the heat peelable pressure-sensitive adhesive is used.

An example of the heat peelable pressure-sensitive adhesive is a heat foamable pressure-sensitive adhesive in which heat expandable fine particles are compounded in an acrylic polymer, or the like. The pressure-sensitive adhesive layer foams or expands by heating the chip-shaped workpiece pasting region, and the surface of the pressure-sensitive adhesive layer is changed into an uneven surface. As a result, the adhesive power at the chip-shaped workpiece pasting region decreases, and a difference in the adhesive power between the chip-shaped workpiece pasting region and the frame pasting region is formed.

The heat expandable fine particles are not especially limited, and various inorganic or organic heat expandable fine small spheres can be used. Further, expandable fine particles that are formed by making a heat expandable substance into microcapsules can also be used. When the heat peelable pressure-sensitive adhesive is used, there is no need to provide the radiation shielding layer (the printing layer 20).

In the tape for holding a chip 10 according to the first embodiment, the case of the frame pasting region 16 and the chip pasting region 18 being continuous is explained. However, a space may be provided between the frame pasting region and the chip-shaped workpiece pasting region as shown below.

[Second Embodiment]

Figure 4:
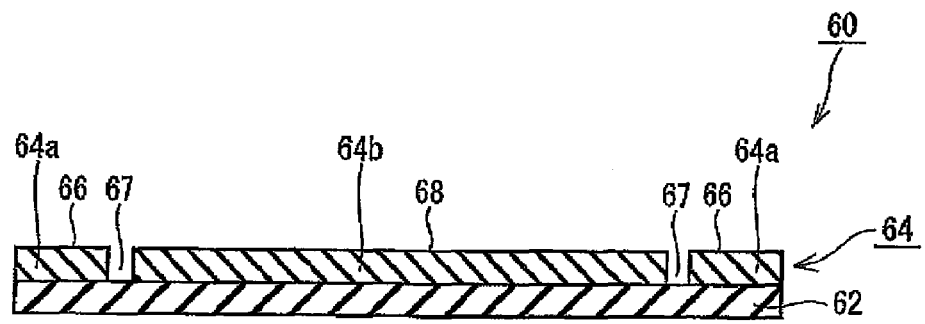
FIG. 4 is a schematic sectional drawing showing a tape for holding a chip according to a second embodiment of the present invention.

FIG. 4 is a schematic sectional drawing showing a tape for holding a chip according to a second embodiment of the present invention. As shown in FIG. 4, a tape for holding a chip 60 has a base 62 and a pressure-sensitive adhesive layer 64 that is laminated on the base 62. The base 62 can have the same configuration as the base 12 according to the first embodiment. The pressure-sensitive adhesive layer 64 is configured with a strong pressure-sensitive adhesive layer 64*a* that is formed along the outer circumference in a plan view and whose surface corresponds to a frame pasting region 66 and a weak pressure-sensitive adhesive layer 64*b* that is formed in the center in a plan view and whose surface corresponds to a chip pasting region 68. Further, a space 67 is provided at the boundary of the frame pasting region 66 and the chip pasting region 68. A space may be provided between the chip-shaped workpiece pasting region and the frame pasting region as described above in the present invention as long as the size of the space is within a range that the chip-shaped workpiece pasting region does not become remarkably small.

The method of forming the pressure-sensitive adhesive layer 64 is not especially limited, but a method of applying pressure-sensitive adhesive composition solutions with different compositions on each of the frame pasting region 66 and the chip pasting region 68 can be adopted, for example. That is, a method of manufacturing a tape for holding a chip can be adopted having a step of forming the pressure-sensitive adhesive layer 64 under the condition that not both of the strong pressure-sensitive adhesive layer and the weak pressure-sensitive adhesive layer are laminated on each other on the base using a pressure-sensitive adhesive composition solution for forming a strong pressure-sensitive adhesive layer (for forming the frame pasting region 66) and a pressure-sensitive adhesive composition solution for forming a weak pressure-sensitive adhesive layer (for forming the chip pasting region 68). In this case, there is no need to use a radiation curable pressure-sensitive adhesive, and a general pressure-sensitive adhesive may be used. As the tape for holding a chip 10 (refer to FIG. 1A), an ultraviolet ray shielding layer (the printing layer 20) may be provided and a difference in the adhesive power may be provided between the frame pasting region 66 and the chip pasting region 68 as the pressure-sensitive adhesive layer by exposure to radiation using a radiation curable pressure-sensitive adhesive. When using the radiation curable pressure-sensitive adhesive, the radiation curable pressure-sensitive adhesive that is explained in the first embodiment can be used.

The adhesive power to a silicon mirror wafer at the frame pasting region 66 is 5 times, and preferably 10 times or more that at the chip pasting region 68. Because the peeling adhesive power at the frame pasting region 66 is 5 times or more the peeling adhesive power at the chip pasting region 68, the mount frame can be firmly pasted to the frame pasting region 66 where the adhesive power is relatively strong and the semiconductor chip 42 can be pasted to the chip pasting region 68 where the adhesive power is relatively weak in a manner that is can be pasted and peeled off.

The adhesive power at the frame pasting region 66 is preferably 0.2 to 20 N/20-mm tape width and more preferably 0.3 to 10 N/20-mm tape width. By making it 0.2 N/20-mm tape width or more, the tape can be firmly fixed to the mount frame. By making it 20 N/20-mm tape width or less, the pressure-sensitive adhesive can be prevented from remaining on the mount frame.

The adhesive power at the chip pasting region 68 is preferably 0.01 to 0.1 N/20 mm-tape width and more preferably 0.02 to 0.08 N/20 mm-tape width. The adhesive powers at the frame pasting region 66 and the chip pasting region 68 are values that are measured following JIB Z 0237, and they are values when pasted to a silicon mirror wafer and then the tape for holding a chip 60 is peeled off at a measurement temperature of 23±3° C., an angle θ between the surface of the pressure-sensitive adhesive layer 64 (the strong pressure-sensitive adhesive layer 64a and the weak pressure sensitive adhesive layer 64b) and the surface of the silicon mirror wafer of 180°, and a tensile speed of 300 mm/min. When the adhesive power at the chip pasting region 68 is 0.01 N/20 mm-tape width or more, the semiconductor chip 42 is surely pasted and prevented from falling off. When it is 0.1 N/20 mm-tape width or less, the tape can be peeled off without operations such as heating and exposure to radiation upon peeling.

The Young's modulus at the frame pasting region 66 is preferably 0.01 to 2 MPa and more preferably 0.05 to 1 MPa.

The Young's modulus at the chip pasting region 68 is preferably 3 MPa or more and more preferably 5 MPa or more. Further, the Young's modulus at the chip pasting region 68 is preferably 1000 MPa or less and more preferably 100 MPa or less. When the Young's modulus at the chip pasting region 68 is 3 MPa or more, the chip can be easily peeled off. When the Young's modulus at the chip pasting region 68 is 1000 MPa or less, the chip can be easily fixed.

In the present invention, the frame pasting region and the chip-shaped workpiece pasting region may be formed as follows.

[Third Embodiment]

Figure 5:
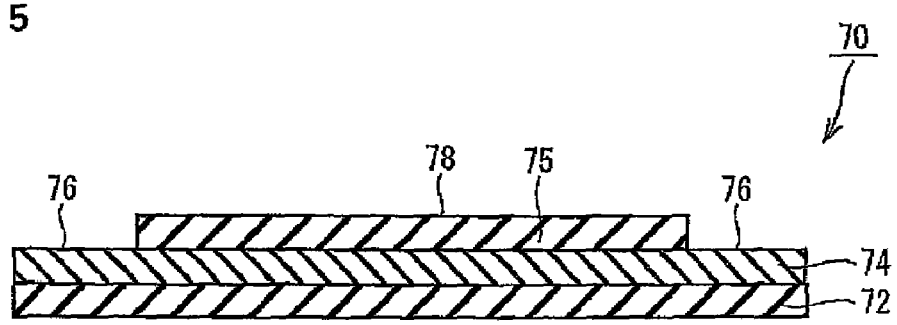
FIG. 5 is a schematic sectional drawing showing a tape for holding a chip according to a third embodiment of the present invention.

FIG. 5 is a schematic sectional drawing showing a tape for holding a chip according to a third embodiment of the present invention. As shown in FIG. 5, the tape for holding a chip 70 has a base 72, a strong pressure-sensitive adhesive layer 74 that is laminated on the base 72, and a weak pressure-sensitive adhesive layer 75 that is laminated on the strong pressure-sensitive adhesive layer 74. The base 72 can have the same configuration as the base 12 according to the first embodiment. The area of the weak pressure-sensitive adhesive layer 75 in a plan view is smaller than that of the strong pressure-sensitive adhesive layer 74, and the weak pressure-sensitive adhesive layer 75 is laminated on the strong pressure-sensitive adhesive layer 74 so that the outer circumference part of the strong pressure-sensitive adhesive layer 74 is exposed. The frame pasting region 76 where the outer circumference part of the strong pressure-sensitive adhesive layer 74 is exposed is a region onto which a mount frame is pasted, and the surface of the weak pressure-sensitive adhesive layer 75 (the chip pasting region 78) is a region to which an individualized chip-shaped workpiece is pasted.

A method of producing the tape for holding a chip 70 is not especially limited, but a method of manufacturing a tape for holding a chip can be adopted having a step of forming a strong pressure-sensitive adhesive layer on a base and a step of forming a weak pressure-sensitive adhesive layer on the strong pressure-sensitive adhesive layer under the condition that the outer circumference part of the surface of the strong pressure-sensitive adhesive layer is exposed. Examples of such a method of manufacturing include a method of forming the strong pressure-sensitive adhesive layer 74 on the base 72 by application and pasting the product to the weak pressure-sensitive adhesive layer 75 that is separately produced and a method of obtaining the weak pressure-sensitive adhesive layer 75 by applying a pressure-sensitive adhesive composition solution to the strong pressure-sensitive adhesive layer 74 that is formed on the base 72. When the weak pressure-sensitive adhesive layer 75 is produced separately, it may be produced by using a pressure-sensitive adhesive composition solution that is produced by appropriately adjusting the composition so that the adhesive power becomes ⅕ or less of the adhesive power of the strong pressure-sensitive adhesive layer 74, or the weak pressure-sensitive adhesive layer 75 may be produced having a prescribed adhesive power by irradiation with radiation after the pressure-sensitive adhesive is formed using a radiation curable pressure-sensitive adhesive. When using the radiation curable pressure-sensitive adhesive, the radiation curable pressure-sensitive adhesive that is explained in the first embodiment can be used.

The adhesive power to a silicon mirror wafer at the strong pressure-sensitive adhesive layer 74 is 5 times, and preferably 10 times or more that at the weak pressure-sensitive adhesive layer 75. Because the peeling adhesive power at the strong pressure-sensitive adhesive layer 74 is 5 times or more the peeling adhesive power at the weak pressure-sensitive adhesive layer 75, the mount frame can be firmly pasted to the strong pressure-sensitive adhesive layer 74 where the adhesive power is relatively strong and the semiconductor chip 42 can be pasted to the weak pressure-sensitive adhesive layer 75 where the adhesive power is relatively weak in a manner that is can be pasted and peeled off.

The adhesive power at the strong pressure-sensitive adhesive layer 74 is preferably 0.2 to 20 N/20-mm tape width and more preferably 0.3 to 10 N/20-mm tape width. By making it 0.2 N/20-mm tape width or more, the tape can be firmly fixed to the mount frame. By making it 20 N/20-mm tape width or less, the pressure-sensitive adhesive can be prevented from remaining on the mount frame.

The adhesive power at the weak pressure-sensitive adhesive layer 75 is preferably 0.01 to 0.1 N/20-mm tape width and more preferably 0.02 to 0.08 N/20-mm tape width. The adhesive power at the strong pressure-sensitive adhesive layer 74 and the weak pressure-sensitive adhesive layer 75 are values that are measured following JIS Z 0237, and they are values when pasted to a silicon mirror wafer and then the tape for holding a chip 70 is peeled off at a measurement temperature of 23±3° C., an angle θ between the surface of the strong pressure-sensitive adhesive layer 74 or the weak pressure-sensitive adhesive layer 75 and the surface of the silicon mirror wafer of 180°, and a tensile speed of 300 mm/min.

When the adhesive power at the weak pressure-sensitive adhesive layer 75 is 0.01 N/20-mm tape width or more, the semiconductor chip 42 is surely pasted and prevented from falling off. When it is 0.1 N/20-mm tape width or less, the tape can be peeled off without operations such as heating and exposure to radiation upon peeling.

The Young's modulus at the strong pressure-sensitive adhesive layer 74 is preferably 0.01 to 2 MPa and more preferably 0.05 to 1 MPa.

The Young's modulus at the weak pressure-sensitive adhesive layer 75 is preferably 3 MPa or more and more preferably 5 MPa or more. Further, the Young's modulus at the weak pressure-sensitive adhesive layer 75 is preferably 1000 MPa or less and more preferably 100 MPa or less. When the Young's modulus at the chip-shaped workpiece pasting region is 3 MPa or more, the chip can be easily peeled off. When the Young's modulus at the weak pressure-sensitive adhesive layer 75 is 1000 MPa or less, the chip can be easily fixed.

[Fourth Embodiment]

Figure 6:
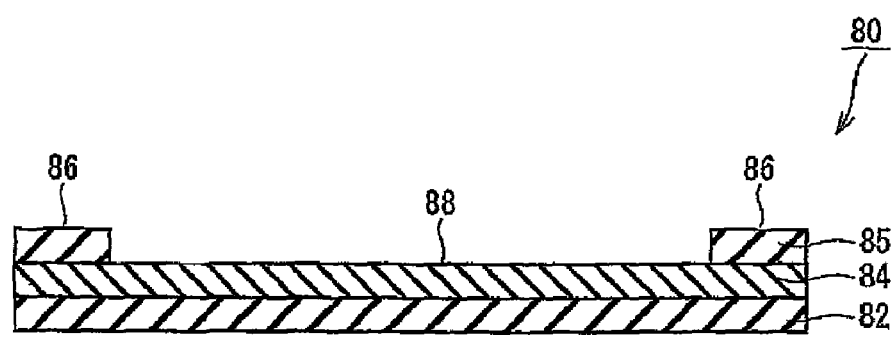
FIG. 6 is a schematic sectional drawing showing a tape for holding a chip according to a fourth embodiment of the present invention.

FIG. 6 is a schematic sectional drawing showing a tape for holding a chip according to a fourth embodiment of the present invention. As shown in FIG. 6, a tape for holding a chip 80 has a base 82, a weak pressure-sensitive adhesive layer 84 that is laminated on the base 82, and a strong pressure-sensitive adhesive layer 85 that is laminated on the weak pressure-sensitive adhesive layer 84. The base 82 can have the same configuration as the base 12 according to the first embodiment. The strong pressure-sensitive adhesive layer 85 has a donut shaped frame pasting region 86 where the center portion is cut out so that a chip pasting region 88 located at the center of the weak pressure-sensitive adhesive layer 84 is exposed.

The method of producing the tape for holding a chip 80 is not especially limited, but a method of manufacturing a tape for holding a chip can be adopted having a step of forming a weak pressure-sensitive adhesive layer on a base and a step of forming a strong pressure-sensitive adhesive layer on the weak pressure-sensitive adhesive layer under the condition that the center portion of the weak pressure-sensitive adhesive layer is exposed. The tape for holding a chip 80 can be produced by the same method as that of the tape for holding a chip 70 according to the third embodiment, for example.

The adhesive power to a silicon mirror wafer at the strong pressure-sensitive adhesive layer 85 is 5 times, and preferably 10 times or more that at the weak pressure-sensitive adhesive layer 84. Because the peeling adhesive power of the strong pressure-sensitive adhesive layer 85 is 5 times or more the peeling adhesive power of the weak pressure-sensitive adhesive layer 84, the mount frame can be firmly pasted to the strong pressure-sensitive adhesive layer 85 where the adhesive power is relatively strong and the semiconductor chip 42 can be pasted to the weak pressure-sensitive adhesive layer 84 where the adhesive power is relatively weak in a manner that is can be pasted and peeled off.

The adhesive power at the strong pressure-sensitive adhesive layer 85 is preferably 0.2 to 20 N/20-mm tape width and more preferably 0.3 to 10 N/20-mm tape width. By making it 0.2 N/20-mm tape width or more, the tape can be firmly fixed to the mount frame. By making it 20 N/20-mm tape width or less, the pressure-sensitive adhesive can be prevented from remaining on the mount frame.

The adhesive power at the weak pressure-sensitive adhesive layer 84 is preferably 0.01 to 0.1 N/20-mm tape width and more preferably 0.02 to 0.08 N/20-mm tape width. The adhesive power at the strong pressure-sensitive adhesive layer 85 and the weak pressure-sensitive adhesive layer 84 are values that are measured following JIS Z 0237, and they are values when pasted to a silicon mirror wafer and then the tape for holding a chip 80 is peeled off at a measurement temperature of 23±3° C., an angle θ between the surface of the strong pressure-sensitive adhesive layer 85 or the weak pressure-sensitive adhesive layer 84 and the surface of the silicon mirror wafer of 180°, and a tensile speed of 300 mm/min. When the adhesive power at the weak pressure-sensitive adhesive layer 84 is 0.01 N/20-mm tape width or more, the semiconductor chip 42 is surely pasted and prevented from falling off. When it is 0.1 N/20-mm tape width or less, the tape can be peeled off without operations such as heating and irradiation of a radiation upon peeling.

The Young's modulus at the strong pressure-sensitive adhesive layer 85 is preferably 0.01 to 2 MPa and more preferably 0.05 to 1 MPa.

The Young's modulus at the weak pressure-sensitive adhesive layer 84 is preferably 3 MPa or more and more preferably 5 MPa or more. Further, the Young's modulus at the weak pressure-sensitive adhesive layer 84 is preferably 1000 MPa or less and more preferably 100 MPa or less. When the Young's modulus at the chip-shaped workpiece pasting region is 3 MPa or more, the chip can be easily peeled off. When the Young's modulus at the weak pressure-sensitive adhesive layer 84 is 1000 MPa or less, the chip can be easily fixed.

In the above-described embodiments, a case is explained where the semiconductor chips that are not used are collected, held and stored on the tape for holding a chip. However, the method of using the tape for holding a chip is not limited to this example in the present invention, and it can also be used for transporting an individualized chip-shaped workpiece, for example.

Below, preferred examples of the present invention are explained in detail. However, materials, addition amounts, and the like described in these examples are not intended to limit the scope of the present invention, and are only examples for explanation as long as there is no description of limitation in particular. In addition, "part" means "parts by weight."

(Die bond film A)

20 parts of an epoxy resin (a) (Epicoat 1001 manufactured by Japan Epoxy Resin Co., Ltd.), 22 parts of a phenol resin (b) (MEH7851 manufactured by Mitsui Chemicals, Inc.), 100 parts of an acrylate polymer (c) having ethyl acrylate-methyl methacrylate as a main component (Paracron W-197CM manufactured by Negami Chemical Industrial Co., Ltd.), and 180 parts of spherical silica (SO-25R manufactured by Admatechs Co., Ltd.) as a filler (d) were dissolved in methylethylketone and the concentration was adjusted to be 23.6% by weight. A die bond film A having a thickness of 40 μm was produced by applying a solution of this adhesive composition onto a polyethylene terephthalate release-treated film to which a silicone release treatment was performed and having a thickness of 50 μm and drying it at 130° C. for 2 minutes.

(Die Bond Film B)

A die bond film B was produced in the same manner as in the die bond film A except that the thickness was set at 20 μm.

(Die Bond Film C)

12 parts of an epoxy resin (a) (Epicoat 1001 manufactured by Japan Epoxy Resin Co., Ltd.), 13 parts of a phenol resin (b) (MEH7851 manufactured by Mitsui Chemicals, Inc.), 100 parts of an acrylate polymer (c) having ethyl acrylate-methyl methacrylate as a main component (Paracron W-197CM manufactured by Negami Chemical Industrial Co., Ltd.), and 200 parts of spherical silica (SO-25R manufactured by Admatechs Co., Ltd.) as a filler (d) were dissolved in methylethylketone and the concentration was adjusted to be 23.6% by weight. A die bond film C having a thickness of 40 µm was produced by applying a solution of this adhesive composition onto a polyethylene terephthalate release-treated film to which a silicone release treatment was performed and having a thickness of 50 µm and drying it at 130° C. for 2 minutes.

(Die Bond Film D)

144 parts of an epoxy resin (a) (Epicoat 1004 manufactured by Japan Epoxy Resin Co., Ltd.), 130 sparts of an epoxy resin (b) (Epicoat 827 manufactured by Japan Epoxy Resin Co., Ltd.), 293 parts of a phenol resin (c) (Milex XLC-4L manufactured by Mitsui Chemicals, Inc.), 100 parts of an acrylate polymer (d) having ethyl acrylate-methyl methacrylate as a main component (Paracron W-197CM manufactured by Negami Chemical Industrial Co., Ltd.), and 200 parts of spherical silica (SO-25R manufactured by Admatechs Co., Ltd.) as a filler (e) were dissolved in methylethylketone and the concentration was adjusted to be 23.6% by weight. A die bond film C having a thickness of 40 µm was produced by applying a solution of this adhesive composition onto a polyethylene terephthalate release-treated film to which a silicone release treatment was performed and having a thickness of 50 µm and drying it at 130° C. for 2 minutes.

(Tape for Holding a Chip A)

An acrylic polymer A was obtained by placing 86.4 parts of 2-ethylhexyl acrylate (also referred to as "2EHA" in the following), 13.6 parts of 2-hydroxyethyl acrylate (also referred to as "HEA" in the following), 0.2 parts of benzoyl peroxide, and 65 parts of toluene in a reactor equipped with a cooling tube, a nitrogen introducing tube, a thermometer, and a stirring apparatus and polymerizing the mixture at 61° C. in a nitrogen stream for 6 hours.

An acrylic polymer A' was obtained by adding 14.6 parts of 2-methacryloyloxyethyl isocyanate (also referred to as "MOI" in the following) into the acrylic polymer A and performing an addition reaction at 50° C. in an air stream for 48 hours.

Next, a pressure-sensitive adhesive composition solution A was obtained by adding 2 parts of a polyisocyanate compound (Coronate L manufactured by Nippon Polyurethane Industry Co., Ltd.) and 5 parts of a photopolymerization initiator (Irgacure 651 manufactured by Ciba Specialty Chemicals Inc.) into 100 parts of the acrylic polymer A'.

A pressure-sensitive adhesive layer having a thickness of 10 µm was formed by applying the pressure-sensitive adhesive composition solution A onto the surface of a PET release liner to which a silicone treatment was performed and heat drying the solution at 120° C. for 2 minutes. Next, a polyolefin film was pasted onto the pressure-sensitive adhesive layer that was formed. This polyolefin film had a thickness of 100 µm, and a printing layer that shields radiation was formed on a portion corresponding to the frame pasting region in advance. After that, a tape for holding a chip A was produced by performing a crosslinking treatment by heating the laminate at 50° C. for 24 hours and irradiating the laminate with an ultraviolet ray from the polyolefin film side with an ultraviolet ray irradiating apparatus (trade name: UM-810) manufactured by Nitto Seiki Co., Ltd. so that the accumulative amount became 400 mJ/cm² at an illumination intensity of 20 mW/cm².

(Tape for Holding a Chip B)

A tape for holding a chip B was produced in the same manner as in the tape for holding a chip A except that the pressure-sensitive adhesive solution was prepared by adding 8 parts of a polyisocyanate compound (Coronate L manufactured by Nippon Polyurethane Industry Co., Ltd.) and 5 parts of a photopolymerization initiator (Irgacure 651 manufactured by Ciba Specialty Chemicals Inc.) into 100 parts of the acrylic polymer A'.

(Tape for Holding a Chip C)

A tape for holding a chip C was produced in the same manner as in the tape for holding a chip A except that the pressure-sensitive adhesive solution was prepared by adding 2 parts of a polyisocyanate compound (Coronate L manufactured by Nippon Polyurethane Industry Co., Ltd.) and 5 parts of a photopolymerization initiator (Irgacure 184 manufactured by Ciba Specialty Chemicals Inc.) into 100 parts of the acrylic polymer A'.

(Tape for Holding a Chip D)

An acrylic polymer B was obtained by placing 50.0 parts of butyl acrylate, 50.0 parts of ethyl acrylate, 16.0 parts of HEA, 0.2 parts of benzoyl peroxide, and 65 parts of toluene in a reactor equipped with a cooling tube, a nitrogen introducing tube, a thermometer, and a stirring apparatus and polymerizing the mixture at 61° C. in a nitrogen stream for 6 hours.

An acrylic polymer B' was obtained by performing an addition reaction on the acrylic polymer B with 20.0 parts of MOI at 50° C. in an air stream for 48 hours.

Next, a pressure-sensitive adhesive composition solution B was prepared by adding 1 part of a polyisocyanate compound (Coronate L manufactured by Nippon Polyurethane Industry Co., Ltd.), 3 parts of a photopolymerization initiator (Irgacure 651 manufactured by Ciba Specialty Chemicals Inc.), and 30 parts of an UV curable oligomer (Shikoh UV-1700B manufactured by Nippon Synthetic Chemical Industry Co., Ltd.) into 100 parts of the acrylic polymer B'.

A pressure-sensitive adhesive layer having a thickness of 10 µm was formed by applying the pressure-sensitive adhesive composition solution B onto the surface of a PET release liner to which a silicone treatment was performed and heat drying the solution at 120° C. for 2 minutes. Next, a polyolefin film was pasted onto the pressure-sensitive adhesive layer that was formed. This polyolefin film had a thickness of 100 µm, and a printing layer that shields radiation was formed on a portion corresponding to the frame pasting region in advance. After that, a tape for holding a chip D was produced by performing a crosslinking treatment by heating at 50° C. for 24 hours.

(Tape for Holding a Chip E)

A pressure-sensitive adhesive layer having a thickness of 10 µm was formed by applying the pressure-sensitive adhesive composition solution A onto the surface of a PET release liner to which a silicone treatment was performed and heat drying the solution at 120° C. for 2 minutes. Then, a pressure-sensitive adhesive layer X sandwiched by PET release liners was produced by pasting a silicone treated surface of another PET release liner. After that, the pressure-sensitive adhesive layer X was irradiated with an ultraviolet ray using an ultraviolet ray irradiating apparatus (trade name: UM-810) manufactured by Nitto Seiki Co., Ltd. so that the accumulative amount became 400 mJ/cm² at an illumination intensity of 20 mW/cm².

On the other hand, a pressure-sensitive adhesive layer Y having a thickness of 10 µm was formed by applying the pressure-sensitive adhesive composition solution B onto the surface of a PET release liner to which a silicone treatment was performed and heat drying the solution at 120° C. for 2 minutes. Next, a polyolefin film having a thickness of 100 µm and on which light shielding printing was not performed was pasted onto the pressure-sensitive adhesive layer Y. After that, a crosslinking treatment was performed by heating at 50° C. for 24 hours.

Next, a tape for holding a chip E was produced by cutting the pressure-sensitive adhesive layer X sandwiched by the PET release liners into a piece having a size corresponding to that of the chip pasting region, peeling one side of the PET release liners off, and pasting the cut piece to the pressure-sensitive adhesive layer Y from which the PET release liner was peeled off so that the pressure-sensitive adhesive layers adhered closely to each other.

(Tape for Holding a Chip F)

A pressure-sensitive adhesive layer having a thickness of 10 μm was formed by applying the pressure-sensitive adhesive composition solution B onto the surface of a PET release liner to which a silicone treatment was performed and heat drying the solution at 120° C. for 2 minutes. Then, a pressure-sensitive adhesive layer X' sandwiched by PET release liners was produced by pasting a silicone treated surface of another PET release liner.

On the other hand, a pressure-sensitive adhesive layer Y' having a thickness of 10 μm was formed by applying the pressure-sensitive adhesive composition solution A onto the surface of a PET release liner to which a silicone treatment was performed and heat drying the solution at 120° C. for 2 minutes. Next, a polyolefin film having a thickness of 100 μm and on which light shielding printing was not performed was pasted onto the pressure-sensitive adhesive layer Y'. After that, a crosslinking treatment was performed by heating at 50° C. for 24 hours and irradiating the laminate with an ultraviolet ray from the polyolefin film side with an ultraviolet ray irradiating apparatus (trade name: UM-810) manufactured by Nitto Seiki Co., Ltd. so that the accumulative amount became 400 mJ/cm² at an illumination intensity of 20 mW/cm².

Next, a tape for holding a chip F was produced by scooping out the pressure-sensitive adhesive layer X' sandwiched by the PET release liners so that a portion that became the chip pasting region was exposed, peeling one side of the PET release liners off, and pasting the cut piece to the pressure-sensitive adhesive layer Y' from which the PET release liner was peeled off so that the pressure-sensitive adhesive layers adhered closely to each other.

The following evaluations were performed with the tapes for holding a chip A to C respectively being Examples 1 to 3, the tape for holding a chip E being Example 4, the tape for holding a chip F being Example 5, and the tape for holding a chip D being Comparative Example 1.

<Measurement of the Adhesive Power to a Silicon Mirror Wafer>

First, a silicon mirror wafer was wiped with a cloth soaked in toluene, then wiped with a cloth soaked in methanol, and then wiped with a cloth soaked in toluene. Next, the chip pasting region and the frame pasting region of each of the tapes for holding a chip A to F were cut into a rectangular piece of 20-mm in tape width, the release liner was peeled off, and the rectangular piece was pasted to the silicon mirror wafer. After that, it was left in a room temperature atmosphere for 30 minutes.

After leaving the laminate for 30 minutes, the peeling adhesive power of the tapes for holding a chip A to F was measured according to JIS 20237. As the peeling conditions, the angle θ between the surface of the pressure-sensitive adhesive layer and the surface of the silicon mirror wafer was set at 180', the tensile speed was set at 300 mm/min, and the temperature was set at room temperature (23° C.). The result is shown in Table 1.

<Measurement of the Young's Modulus of the Pressure-Sensitive Adhesive Layer>

In order to measure the Young's modulus of the pressure-sensitive adhesive layer, a pressure-sensitive adhesive layer having a thickness of 10 μm was formed by applying each of the pressure-sensitive adhesive composition solutions for the tapes for holding a chip A to D onto the surface of a PET release liner to which a silicone treatment was performed and heat drying the solution at 120° C. for 2 minutes. Then, a pressure-sensitive adhesive layers sandwiched by PET release liners (corresponding to the pressure-sensitive adhesive layers of Examples 1 to 6) was produced by pasting a silicone treated surface of another PET release liner. Next, the Young's modulus at the frame pasting region and the Young's modulus at the chip pasting region were measured. The Young's modulus at the frame pasting region was measured by cutting each of the pressure-sensitive adhesive layer sandwiched by the PET release liners into a rectangular piece of 100 mm long and 50 mm wide, peeling one side of the PET release liners off, and rolling only the pressure-sensitive adhesive layer into a cylindrical shape. For measuring the Young's modulus at the chip pasting region, the pressure-sensitive adhesive layer sandwiched by the PET release liners was produced, it was irradiated with an ultraviolet ray using an ultraviolet ray irradiating apparatus (trade name: UM-810) manufactured by Nitto Seiki Co., Ltd. so that the accumulative amount becomes 400 mJ/cm² at an illumination intensity of 20 mW/cm², and after that, the Young's modulus was measured in the same manner as in the Young's modulus at the frame pasting region. The measurement was performed with a tensile tester under conditions of a measurement temperature of 23±3° C., a measurement humidity of 55±10% Rh, and a tensile speed of 50 mm/min. The result is shown in Table 1.

<Measurement of the Shear Adhering Strength>

The surface of the base of each of the tapes for holding a chip A to F was lined with a PET (polyethylene terephthalate) film, a sample obtained by cutting the frame pasting region into pieces of 10 mm in width was pasted to an SUS304BA plate, and it was stretched in the horizontal direction at 50 mm/min. The maximum stress at this time was measured as the shear adhering strength. The pasting portion to the SUS304BA plate had a size of 10 mm×10 mm. The result is shown in Table 1.

<Measurement of a Fixed Load Peeling Speed>

It was measured by the following procedures (a) to (c).

(a) The frame pasting region of each of the tapes for holding a chip A to F was cut into pieces of 20 mm in width and press bonded to an SUS304BA plate by moving a 2 kg roller back and forth once.

(b) A weight of 2 g was placed at one end of each of the tapes for holding a chip A to F in a 90° direction (in the vertical direction) under the condition that the SUS304BA plate on which each of the tapes for holding a chip A to F was pasted was kept horizontal with each of the tapes for holding a chip A to F as the lower surface.

(c) A 5 point measurement of the peeled length was performed every 2 hours from the beginning of the measurement.

(d) A linear approximation was performed from the 5 point measurement values, and a slope of the straight line was defined as the peeling speed. A least-square method was adopted for the linear approximation. The result is shown in Table 1.

TABLE 1

|  | Example 1 | Example 2 | Example 3 | Example 4 | Example 5 | Comparative Example 1 |
|---|---|---|---|---|---|---|
| Adhesive power (N/20 mm) at chip pasting region | 0.05 | 0.05 | 0.03 | 0.05 | 0.05 | 3.1 |
| Adhesive power (N/20 mm) at frame pasting region | 1.6 | 0.3 | 1.4 | 3.2 | 3.1 | 3.1 |
| Young's modulus (MPa) at chip pasting region | 7-10 | 15 | 13-17 | 7-10 | 7-10 | 0.2 |
| Young's modulus (MPa) at frame pasting region | 0.2-0.8 | 0.8 | 0.2-0.3 | 0.2-0.8 | 0.2-0.8 | 0.2 |
| Shear adhering strength (N/100 mm$^2$) | 36 | 33 | 35 | 60 | 60 | 60 |
| Fixed load peeling speed (mm/hour) | 5.6 | 10.9 | 6.1 | Less than 0.1 | Less than 0.1 | Less than 0.1 |

EXAMPLE 6

<Measurement of the Peeling Power to the Die Bond Film>

Each of the die bond films A to D was pasted to the chip pasting region of the tape for holding a tape A. Next, the release liner on the die bond film side was peeled, and the die bond film was lined with a PET film having a thickness of 50 μm interposing a pressure-sensitive adhesive 10 μm in thickness. It was cut into pieces of 20 mm in width, and the peeling power was measured by stretching the tape for holding a chip A and the lined die bond film. The measurement was performed under conditions of a measurement temperature of 23±3° C., a measurement humidity of 55±10% Rh, a peeling angle of 180°, and a peeling speed of 300 mm/min. The result is shown in Table 2.

<Production of a Chip with a Die Bond Film>

First, each of dicing die bond films A to D was produced in which each of the die bond films A to D was laminated on the dicing film (the tape for holding a chip A was used as the dicing film). Next, a silicon mirror wafer that was ground to a thickness of 50 μm was mounted to each of the dicing die bond films A to D, and it was diced into a chip of 10 mm square by blade dicing processing. Chips with a die bond film A to D were produced by peeling the obtained chips off the die bond film.

<Evaluation of Chip Falling (Pasted at Room Temperature)>

The release liner of the tape for holding a chip A was peeled, and pasted and fixed to a mount frame. After that, each of the produced chips with a die bond film A to D was pasted to the chip pasting region of the tape for holding a chip A in the direction to paste the die bond film side, and left at room temperature for 30 minutes. As the pasting conditions, the pasting temperature was set at 23° C., the pasting pressure was set at 0.2 MPa, and the pressing time was set at 0.1 seconds.

The mount frame was turned upside down under the condition that chips with a die bond film A to D were pasted and patted at room temperature, and the evaluation was performed as to the number of chips that fell. In the evaluation, 5 of each of the chips with a die bond film A to D was used, the case where none fell was marked ○, the case where 1 to 4 chips fell was marked "Δ", and the case where all 5 chips fell was marked X. The result is shown in Table 2.

<Evaluation of Chip Falling (Held at 0° C.)>

The release liner of the tape for holding a chip A was peeled off, and pasted and fixed to a mount frame. After that, each of the produced chips with a die bond film A to D was pasted to the chip pasting region of the tape for holding a chip A in the direction to paste the die bond film side, and cooled at 0° C. for 24 hours. After that, the mount frame was turned upside down and patted in a 0° C. environment, and the evaluation was performed as to the number of chips that fell. In the evaluation, 5 of each of the chips with a die bond film A to D was used, the case where none fell was marked ○, the case where 1 to 4 chips fell was marked "Δ", and the case where all 5 chips fell was marked X. The result is shown in Table 2.

<Evaluation of Pickup Property>

The release liner of the tape for holding a chip A was peeled, and pasted and fixed to a mount frame. After that, each of the produced chips with a die bond film A to D was placed and pasted to the chip pasting region of the tape for holding a chip A in the direction to paste the die bond film side, and left at room temperature for 30 minutes. Each of the chips with a die bond film A to D was picked up from the tape for holding a chip A using the produced sample. The evaluation of the pickup property was performed using a sample right after production and a sample that was left at room temperature for one month. The pickup conditions were as follows.

<Pickup Conditions>

Die bonder: SPA-300 manufactured by Shinkawa Ltd.
Mount frame: 2-8-1 manufactured by DISCO Corporation
Wafer type: Mirror wafer (no pattern)
Size of the chip: 10 mm×10 mm
Thickness of the chip: 50 μm
Number of needles: 9 needles
Needle pushing speed: 5 mm/sec
Collet maintaining time: 1000 msec
Expand: Amount of pulling down 3 mm
Needle pushing distance: 300 μm In the evaluation, 10 chips where picked up and the case where all chips were picked up was marked ○, the case where 1 to 9 chips were picked up was marked "Δ", and the case where no chips were picked up was marked X. The result is shown in Table 2.

TABLE 2

|  | Die bond film A | Die bond film B | Die bond film C | Die bond film D |
|---|---|---|---|---|
| Peeling power (N/20 mm) | 0.06 | 0.07 | 0.05 | 0.03 |
| Chip falling (normal temperature) | ○ | ○ | ○ | ○ |
| Chip falling (0° C.) | ○ | ○ | ○ | ○ |
| Pickup property (right after production) | ○ | ○ | ○ | ○ |
| Pickup property (after one month) | ○ | ○ | ○ | ○ |

EXAMPLE 7

Tests that are the same as in Example 6 were performed except that the tape for holding a chip A of Example 6 was changed to the tape for holding a chip B. The result is shown in Table 3.

TABLE 3

|  | Die bond film A | Die bond film B | Die bond film C | Die bond film D |
| --- | --- | --- | --- | --- |
| Peeling power (N/20 mm) | 0.05 | 0.06 | 0.05 | 0.03 |
| Chip falling (normal temperature) | ○ | ○ | ○ | ○ |
| Chip falling (0° C.) | ○ | ○ | ○ | ○ |
| Pickup property (right after production) | ○ | ○ | ○ | ○ |
| Pickup property (after one month) | ○ | ○ | ○ | ○ |

EXAMPLE 8

Tests that are the same as in Example 6 were performed except that the tape for holding a chip A of Example 6 was changed to the tape for holding a chip C. The result is shown in Table 4.

TABLE 4

|  | Die bond film A | Die bond film B | Die bond film C | Die bond film D |
| --- | --- | --- | --- | --- |
| Peeling power (N/20 mm) | 0.03 | 0.04 | 0.03 | 0.02 |
| Chip falling (normal temperature) | ○ | ○ | ○ | ○ |
| Chip falling (0° C.) | ○ | ○ | ○ | ○ |
| Pickup property (right after production) | ○ | ○ | ○ | ○ |
| Pickup property (after one month) | ○ | ○ | ○ | ○ |

EXAMPLE 9

Tests that are the same as in Example 6 were performed except that the tape for holding a chip A of Example 6 was changed to the tape for holding a chip E. The result is shown in Table 5.

TABLE 5

|  | Die bond film A | Die bond film B | Die bond film C | Die bond film D |
| --- | --- | --- | --- | --- |
| Peeling power (N/20 mm) | 0.06 | 0.07 | 0.05 | 0.03 |
| Chip falling (normal temperature) | ○ | ○ | ○ | ○ |
| Chip falling (0° C.) | ○ | ○ | ○ | ○ |
| Pickup property (right after production) | ○ | ○ | ○ | ○ |
| Pickup property (after one month) | ○ | ○ | ○ | ○ |

EXAMPLE 10

Tests that are the same as in Example 6 were performed except that the tape for holding a chip A of Example 6 was changed to the tape for holding a chip F. The result is shown in Table 6.

TABLE 6

|  | Die bond film A | Die bond film B | Die bond film C | Die bond film D |
| --- | --- | --- | --- | --- |
| Peeling power (N/20 mm) | 0.06 | 0.07 | 0.05 | 0.03 |
| Chip falling (normal temperature) | ○ | ○ | ○ | ○ |
| Chip falling (0° C.) | ○ | ○ | ○ | ○ |
| Pickup property (right after production) | ○ | ○ | ○ | ○ |
| Pickup property (after one month) | ○ | ○ | ○ | ○ |

EXAMPLE 11

<Measurement of the Peeling Power to a Silicon Chip>

A silicon mirror wafer was back-grinded with #2000 and ground to a thickness of 500 µm. The ground surface was wiped with a cloth soaked in toluene, wiped with a cloth soaked in methanol, and wiped with a cloth soaked with toluene. Next, the chip pasting region of each of the tapes for holding a chip A to F was cut into a rectangular piece of 20-mm in tape width, the release liner was peeled off, and the rectangular piece was pasted to the ground surface of the wafer. After that, it was left in a room temperature atmosphere for 30 minutes, and then the peeling adhesive power of the tape for holding a chip A was measured according to JIS Z0237. As the peeling conditions, the angle between the surface of the pressure-sensitive adhesive layer and the surface of the silicon mirror wafer was set at 180°, the tensile speed was set at 300 mm/rain, and the temperature was set at room temperature (23° C.). The result is shown in Table 7.

<Production of a Silicon Chip>

A silicon mirror wafer was back-grinded with #2000 and ground to a thickness of 100 µm. It was mounted to the dicing film (the tape for holding a chip A was used as the dicing film), and it was diced into a chip of 10 mm square by blade dicing processing. A silicon chip A was obtained by peeling the obtained chip off the die bond film.

<Evaluation of Chip Falling (Pasted at Room Temperature)>

The release liner of the tape for holding a chip A was peeled off, and pasted and fixed to a mount frame. After that, each of the produced silicon chip A was pasted to the chip pasting region of the tape for holding a chip A, and left at room temperature for 30 minutes. As the pasting conditions, the pasting temperature was set at 23° C., the pasting pressure was set at 0.2 MPa, and the pressing time was set at 0.1 seconds.

The mount frame was turned upside down under the condition that the silicon chip A was pasted and patted at room temperature, and the evaluation was performed from a number of chips that fell. In the evaluation, 5 silicon chips A were used, the case where none fell was marked ○, the case where 1 to 4 chips fell was marked "Δ", and the case where all 5 chips fell was marked X. The result is shown in Table 7.

<Evaluation of Chip Falling (Held at 0° C.)>

The release liner of the tape for holding a chip A was peeled, and pasted and fixed to a mount frame. After that, each of the produced silicon chip A was placed and pasted to the chip pasting region of the tape for holding a chip A, and cooled at 0° C. for 24 hours. After that, the mount frame was turned upside down and patted in a 0° C. environment, and the evaluation was performed as to the number of chips that fell. In the evaluation, 5 silicon chips A were used, the case where none fell was marked ○, the case where 1 to 4 chips fell was marked "A", and the case where all 5 chips fell was marked X.

The result is shown in Table 7.

<Evaluation of Pickup Property>

The release liner of the tape for holding a chip A was peeled, and pasted and fixed to a mount frame. After that, the produced chip A was placed and pasted to the chip pasting region of the tape for holding a chip A, and left at room temperature for 30 minutes. The silicon chip A was picked up from the tape for holding a chip A using the produced sample. The evaluation of the pickup property was performed using a sample right after production and a sample that was left at room temperature for one month. The pickup conditions were as follows.

<Pickup Conditions>

Die bonder: SPA-300 manufactured by Shinkawa Ltd.

Mount frame: 2-8-1 manufactured by DISCO Corporation

Wafer type: Mirror wafer (no pattern)

Size of the chip: 10 mm×10 mm

Thickness of the chip: 100 μm

Number of needles: 9 needles

Needle pushing speed; 5 mm/sec

Collet maintaining time: 1000 msec

Expand: Amount of pulling down 3 mm

Needle pushing distance: 300 μm

The evaluation was performed by picking up 10 chips. The case where all chips were picked up was marked ○, the case where 1 to 9 chips were picked up was marked "A", and the case where no chips were picked up was marked X. The result is shown in Table 7.

TABLE 7

|  | Silicon chip A |
|---|---|
| Peeling power (N/20 mm) | 0.05 |
| Chip falling (normal temperature) | ○ |
| Chip falling (0° C.) | ○ |
| Pickup property (right after production) | ○ |
| Pickup property (after one month) | ○ |

EXAMPLE 12

Tests that are the same as in Example 11 were performed except that the tape for holding a chip A of Example 11 was changed to the tape for holding a chip B. The result is shown in Table 8.

TABLE 8

|  | Silicon chip A |
|---|---|
| Peeling power (N/20 mm) | 0.05 |
| Chip falling (normal temperature) | ○ |
| Chip falling (0° C.) | ○ |
| Pickup property (right after production) | ○ |
| Pickup property (after one month) | ○ |

EXAMPLE 13

Tests that are the same as in Example 11 were performed except that the tape for holding a chip A of Example 11 was changed to the tape for holding a chip C. The result is shown in Table 9.

TABLE 9

|  | Silicon chip A |
|---|---|
| Peeling power (N/20 mm) | 0.03 |
| Chip falling (normal temperature) | ○ |
| Chip falling (0° C.) | ○ |
| Pickup property (right after production) | ○ |
| Pickup property (after one month) | ○ |

EXAMPLE 14

Tests that are the same as in Example 11 were performed except that the tape for holding a chip A of Example 11 was changed to the tape for holding a chip E. The result is shown in Table 10.

TABLE 10

|  | Silicon chip A |
|---|---|
| Peeling power (N/20 mm) | 0.05 |
| Chip falling (normal temperature) | ○ |
| Chip falling (0° C.) | ○ |
| Pickup property (right after production) | ○ |
| Pickup property (after one month) | ○ |

EXAMPLE 15

Tests that are the same as in Example 11 were performed except that the tape for holding a chip A of Example 11 was changed to the tape for holding a chip F. The result is shown in Table 11.

TABLE 11

|  | Silicon chip A |
|---|---|
| Peeling power (N/20 mm) | 0.05 |
| Chip falling (normal temperature) | ○ |
| Chip falling (0° C.) | ○ |
| Pickup property (right after production) | ○ |
| Pickup property (after one month) | ○ |

COMPARATIVE EXAMPLE 1

<Measurement of the Peeling Power to the Die Bond Film>

Each of the die bond films A to D was pasted to the chip pasting region of the tape for holding a chip D (on which irradiation with an ultraviolet ray was not performed). Next, the tape for holding a chip D was irradiated with an ultraviolet ray from the base side so that the accumulative amount becomes 400 mJ/cm² at an illumination intensity of 20 mW/cm². After that, the release liner on the die bond film side was peeled, and the die bond film was lined with a 50 μm-thick PET film interposing a pressure-sensitive adhesive of 10 μm in thickness. It was cut into pieces of 20 mm in width, and the peeling power was measured by stretching the tape for holding a chip and the lined die bond film upward and downward at a speed of 300 mm/min. The result is shown in Table 7.

<Evaluation of Chip Falling (Pasted at Room Temperature)>

The release liner of the tape for holding a chip D (on which irradiation with an ultraviolet ray was not performed) was peeled off, and a mount frame was pasted and fixed to the frame pasting region. Next, each of the chips with a die bond film A to D was placed and pasted to the chip pasting region of the tape for holding a chip D, and left at room temperature for 30 minutes. After that, it was irradiated with an ultraviolet ray from the polyolefin film side using an ultraviolet ray irradiating apparatus (trade name: UM-810) manufactured by Nitto Seiki Co., Ltd. so that the accumulative amount becomes 400 mJ/cm² at an illumination intensity of 20 mW/cm². The evaluation of chip falling (pasted at room temperature) was performed on the sample produced in the same manner as in Example 1. The result is shown in Table 12.

<Evaluation of Chip Falling (Held at 0° C.)>

The release liner of the tape for holding a chip D (on which irradiation with an ultraviolet ray was not performed) was peeled off, and a mount frame was pasted and fixed to the frame pasting region. Next, each of the chips with a die bond film A to D was placed and pasted to the chip pasting region of the tape for holding a chip D, and cooled at 0° C. for 24 hours. After that, it was irradiated with an ultraviolet ray from the polyolefin film side using an ultraviolet ray irradiating apparatus (trade name: UM-810) manufactured by Nitto Seiki Co., Ltd. so that the accumulative amount became 400 mJ/cm² at an illumination intensity of 20 mW/cm². The evaluation of chip falling (held at 0° C.) was performed on the sample produced in the same manner as in Example 1. The result is shown in Table 12.

<Evaluation of Pickup Property>

The release liner of the tape for holding a chip D (on which irradiation with an ultraviolet ray was not performed) was peeled off, and a mount frame was pasted and fixed to the frame pasting region. Next, each of the chips with a die bond film A to D was placed and pasted to the chip pasting region of the tape for holding a chip D, and left at room temperature for 30 minutes. Each of the chips with a die bond film A to D was picked up from the tape for holding a chip D using the produced sample. The evaluation of the pickup property was performed after irradiating with an ultraviolet ray from the polyolefin film side using an ultraviolet ray irradiating apparatus (trade name: UM-810) manufactured by Nitta Seiki Co., Ltd. so that the accumulative amount became 400 mJ/cm² at an illumination intensity of 20 mW/cm². Further, the evaluation of the pickup property was performed using a sample right after production and a sample that was left at room temperature for one month. The same pickup conditions were used as Example 1. The result is shown in Table 12.

TABLE 12

|  | Die bond film A | Die bond film B | Die bond film C | Die bond film D |
|---|---|---|---|---|
| Peeling power (N/20 mm) | 5.0 or more | 5.0 or more | 5.0 or more | 5.0 or more |
| Chip falling (normal temperature) | ○ | ○ | ○ | ○ |
| Chip falling (0° C.) | ○ | ○ | ○ | ○ |
| Pickup property (right after production) | x | x | x | x |
| Pickup property (after one month) | x | x | x | x |

(Result)

As can be understood from the results in Tables 2 to 12, the chip can be held without falling and a good pickup property is exhibited when the tape for holding a chip is used in which the 180-degree peeling adhesive power at the frame pasting region is 5 times or more the 180-degree peeling adhesive power at the chip-shaped workpiece pasting region as in Examples 6 to 15.

What is claimed is:

1. A method of holding a chip-shaped workpiece that is formed by dicing, comprising providing a tape for holding a chip, wherein the tape has a configuration in which a pressure-sensitive adhesive layer is formed on a base material, wherein the pressure-sensitive adhesive layer has a chip-shaped workpiece pasting region and a frame pasting region, wherein the pressure-sensitive adhesive layer is characterized in that, when the pressure-sensitive adhesive layer is adhered to a silicon mirror wafer, a 180-degree peeling adhesive power of the pressure-sensitive adhesive layer in the frame pasting region is 5 times or more as compared to the 180-degree peeling adhesive power of the pressure-sensitive adhesive layer in the chip-shaped workpiece pasting region when measured at a temperature of 23 ±3° C. and a tensile speed of 300 mm/min;

providing a chip-shaped workpiece that has been formed by dicing a workpiece into a plurality of chip-shaped workpieces;

pasting a mount frame to the frame pasting region of the tape; and pasting the chip-shaped workpiece to the chip-shaped workpiece pasting region of the tape.

2. A method of manufacturing a semiconductor device, comprising the steps of providing a tape for holding a chip, wherein the tape has a configuration in which a pressure-sensitive adhesive layer is formed on a base material, wherein the pressure-sensitive adhesive layer has a chip-shaped workpiece pasting region and a frame pasting region, wherein the pressure-sensitive adhesive layer is characterized in that, when the pressure-sensitive adhesive layer is adhered to a silicon mirror wafer a 180-degree peeling adhesive power of the pressure-sensitive adhesive layer in the frame pasting region is 5 times or more as compared to the 180-degree peeling adhesive power of the pressure-sensitive adhesive layer in the chip-shaped workpiece pasting region when measured at a temperature of 23 ±3° C. and a tensile speed of 300 mm/min;
dicing a workpiece;
pasting a chip-shaped workpiece that is formed by the dicing of the workpiece to the chip-shaped workpiece pasting region of the tape;
peeling the chip-shaped workpiece that is pasted to the tape; and
fixing the peeled chip-shaped workpiece to an adherend.

3. The method according to claim 2, wherein the peeling step is performed without reducing the 180-degree peeling adhesive power of the chip-shaped workpiece pasting region.

4. The method according to claim 2, wherein the chip-shaped workpiece comprises a resin layer that has adhesive power.

* * * * *

UNITED STATES PATENT AND TRADEMARK OFFICE
CERTIFICATE OF CORRECTION

PATENT NO. : 8,278,151 B2
APPLICATION NO. : 12/969959
DATED : October 2, 2012
INVENTOR(S) : Shuhei Murata et al.

Page 1 of 1

It is certified that error appears in the above-identified patent and that said Letters Patent is hereby corrected as shown below:

In the Specifications:

At Column 9, Line 47, please change "dioldi(meth)acrylate," to --diol di(meth)acrylate,--.

At Column 10, Line 28-29, please change "tetramethylolmethane" to --tetramethylmethane--.

At Column 14, Line 40, after "type, phenol" please change "Novolak" to --Novolac--.

At Column 14, Line 40, after "type, orthocresol" please change "Novolak" to --Novolac--.

At Column 14, Line 41, please change "tetraphenylolethane" to --tetraphenylethane--.

At Column 14, Line 42, please change "glycicylisocyanurate" to --glycidylisocyanurate--.

At Column 14, Line 46, please change "Novolak" to --Novolac--.

At Column 14, Line 47-48, please change "tetraphenylolethane" to --tetraphenylethane--.

At Column 14, Line 52, please change "Novolak" to --Novolac--.

At Column 14, Line 53, please change "Novolak" to --Novolac--.

At Column 14, Line 54, after "creso" please change "Novolak" to --Novolac--.

At Column 14, Line 54, after "resin, tert-butylphenol" please change "Novolak" to --Novolac--.

At Column 14, Line 55, please change "nonyiphenol" to --nonylphenol--.

At Column 14, Line 55, please change "Novolak" to --Novolac--.

At Column 14, Line 58, please change "Novolak" to --Novolac--.

At Column 15, Line 41-42, please change "pentaoxide," to --pentoxide,--.

At Column 16, Line 36, please change "180'," to --180°,--.

At Column 17, Line 49, please change "mount" to --a mount--.

At Column 25, Line 10, please change "sparts" to --parts--.

At Column 27, Line 65, please change "180'," to --180°,--.

At Column 32, Line 32, please change "30 mm/rain," to --30mm/min,--.

Signed and Sealed this
Thirtieth Day of April, 2013

Teresa Stanek Rea
*Acting Director of the United States Patent and Trademark Office*